US011923658B1

(12) United States Patent
Lenius et al.

(10) Patent No.: US 11,923,658 B1
(45) Date of Patent: *Mar. 5, 2024

(54) LASER DIODE FIRING SYSTEM

(71) Applicant: Waymo LLC, Mountain View, CA (US)

(72) Inventors: Samuel William Lenius, Sunnyvale, CA (US); Pierre-yves Droz, Mountain View, CA (US)

(73) Assignee: Waymo LLC, Mountain View, CA (US)

(*) Notice: Subject to any disclaimer, the term of this patent is extended or adjusted under 35 U.S.C. 154(b) by 84 days.

This patent is subject to a terminal disclaimer.

(21) Appl. No.: 17/653,994

(22) Filed: Mar. 8, 2022

Related U.S. Application Data

(63) Continuation of application No. 16/356,575, filed on Mar. 18, 2019, now Pat. No. 11,303,096, which is a continuation of application No. 15/157,578, filed on May 18, 2016, now Pat. No. 10,277,007, which is a continuation of application No. 14/132,219, filed on Dec. 18, 2013, now Pat. No. 9,368,936.

(60) Provisional application No. 61/884,762, filed on Sep. 30, 2013.

(51) Int. Cl.
*G01C 3/08* (2006.01)
*G01S 7/484* (2006.01)
*G01S 17/06* (2006.01)
*H01S 5/042* (2006.01)

(52) U.S. Cl.
CPC ............ *H01S 5/0428* (2013.01); *G01S 7/484* (2013.01); *G01S 17/06* (2013.01)

(58) Field of Classification Search
None
See application file for complete search history.

(56) References Cited

U.S. PATENT DOCUMENTS

| 3,790,277 A | 2/1974 | Hogan |
| 4,244,109 A | 1/1981 | Silverman |
| 4,432,037 A | 2/1984 | Brabetz |

(Continued)

FOREIGN PATENT DOCUMENTS

| JP | S5624990 A | 3/1981 |
| WO | 2012070283 A1 | 5/2012 |

OTHER PUBLICATIONS

McManamon, Dr. Paul F. et al., "A History of Laser Radar in the United States", Laser Radar Technology and Applications XV, Proceedings of SPIE, vol. 7684, 2010, pp. 1-11.

(Continued)

*Primary Examiner* — Mark Hellner
(74) *Attorney, Agent, or Firm* — McDonnell Boehnen Hulbert & Berghoff LLP

(57) ABSTRACT

A laser diode firing circuit for a light detection and ranging device is disclosed. The firing circuit includes a laser diode coupled in series to a transistor, such that current through the laser diode is controlled by the transistor. The laser diode is configured to emit a pulse of light in response to current flowing through the laser diode. The firing circuit includes a capacitor that is configured to charge via a charging path that includes an inductor and to discharge via a discharge path that includes the laser diode. The transistor controlling current through the laser diode can be a Gallium nitride field effect transistor.

20 Claims, 11 Drawing Sheets

(56) References Cited

U.S. PATENT DOCUMENTS

| | | | |
|---|---|---|---|
| 4,648,093 A | 3/1987 | Sasnett et al. | |
| 4,700,301 A | 10/1987 | Dyke | |
| 4,709,195 A | 11/1987 | Hellekson et al. | |
| 5,162,754 A | 11/1992 | Soares | |
| 5,202,742 A | 4/1993 | Frank et al. | |
| 5,241,481 A | 8/1993 | Olsen | |
| 5,604,757 A * | 2/1997 | Liang | H01S 5/4025 398/94 |
| 5,796,767 A | 8/1998 | Aizawa | |
| 5,895,984 A | 4/1999 | Renz | |
| 6,861,828 B2 | 3/2005 | Watanabe | |
| 6,873,203 B1 | 3/2005 | Latham, II et al. | |
| 6,882,409 B1 | 4/2005 | Evans et al. | |
| 7,089,114 B1 | 8/2006 | Huang | |
| 7,184,130 B1 | 2/2007 | Barr | |
| 7,248,342 B1 | 7/2007 | Degnan | |
| 7,255,275 B2 | 8/2007 | Gurevich et al. | |
| 7,969,558 B2 * | 6/2011 | Hall | H01S 5/0428 356/141.5 |
| 7,977,926 B2 | 7/2011 | Williams | |
| 8,115,913 B2 | 2/2012 | Komamaki | |
| 8,188,794 B2 | 5/2012 | Autzenhiser | |
| 8,320,423 B2 | 11/2012 | Stern | |
| 8,767,190 B2 | 7/2014 | Hall | |
| 8,836,922 B1 | 9/2014 | Pennecot et al. | |
| 8,981,673 B2 | 3/2015 | Athalye | |
| 9,185,762 B2 | 11/2015 | Mark et al. | |
| 9,214,783 B2 | 12/2015 | Nomura et al. | |
| 9,285,464 B2 | 3/2016 | Pennecot et al. | |
| 9,368,936 B1 * | 6/2016 | Lenius | G01S 17/10 |
| 9,661,711 B2 | 5/2017 | Gong | |
| 10,141,716 B1 * | 11/2018 | Lenius | G01S 17/06 |
| 10,277,007 B1 * | 4/2019 | Lenius | G01S 17/06 |
| 11,303,096 B1 * | 4/2022 | Lenius | G01S 17/42 |
| 2006/0291512 A1 | 12/2006 | Borschowa | |
| 2007/0280314 A1 | 12/2007 | Keh et al. | |
| 2012/0189028 A1 | 7/2012 | Hoffman et al. | |
| 2012/0235976 A1 | 9/2012 | Van Lier | |
| 2013/0106468 A1 | 5/2013 | Aso | |
| 2013/0314711 A1 | 11/2013 | Cantin et al. | |
| 2014/0077778 A1 | 3/2014 | Sato et al. | |
| 2014/0177305 A1 | 6/2014 | Irish | |
| 2014/0265886 A1 | 9/2014 | Lys et al. | |
| 2014/0269799 A1 | 9/2014 | Ortiz | |
| 2014/0312233 A1 | 10/2014 | Mark et al. | |

OTHER PUBLICATIONS

Touretzky, David S. et al., "What's Hidden in the Hidden Layers", BYTE, Aug. 1989, pp. 227-233.

Downling, Kevin, et al., "Navlab: An Autonomous Navigation Testbed", The Robotics Inst., Carnegie Mellon Univ., Nov. 1987, 52 pages.

"It Began With a Race . . . 16 Years of Velodyne LiDAR", Velodyne LiDAR 360 Blog, http://velodynelidar.com/blog/it-began-with-a-race/, retrieved from the internet May 18, 2017, 10 pages.

"Ghostrider" Robot Motorcyle, Smithsonian Nat'l Museum of American History, http://americanhistory.si.edu/collections/search/object/nmah_1332301, retrieved from the internet May 15, 2017, 2 pages.

McManamon, Paul, "Field Guide to Lidar", SPIE Field Guides, vol. FG36, John E. Grievenkamp, Series Editor, SPIE Press, 2015, 29 pages.

"Laser Radar: Progress and Opportunities in Active Electro-Optical Sensing", National Academies Press, http://www.nap.edu/catalog.php?record_id=18733, 2014, e-book, 39 pages.

HDL-64E S2 Envelope Drawing (2D PDF), Velodyne LiDAR, http://velodynelidar.com/lidar/hdldownloads/86-0105%20REV%20A%20OUTLINE%20DRAWING%20HDL-64E%20S2.pdf, Apr. 21, 2015, 1 page.

Liu, Xingsheng et al., "Packaging of High Power Semiconductor Lasers", Micro-and Opto-Electronic Materials, Structures, and Systems, Springer, 2015, 22 pages.

"Working With a Manufacturer—What Are Fiducials and Why Are They Useful?", Worthington Assembly Inc., http://www.worthingtonassembly.com/blog/2014/12/29/what-are-fiducials-and-why-are-they-useful, Apr. 17, 2015, 5 pages.

Scholz, Christian, "Thermal & Mechanical Optimisation of Diode Laser Bar Packaging", Herstellung und Verlag: Books on Demand GmbH, Norderstedt, ISBN-13: 9783837002607, Jul. 2007, 132 pages.

Mundhenk, T. Nathan et al., "PanDAR: a Wide-Area, Frame-Rate, and Full Color LIDAR With Foveated Region Using Backfilling Interpolation Upsampling", Intelligent Robots and Computer Vision XXXII: Algorithms and Techniques, Proceedings of SPIE, vol. 9406, 2015, pp. 1-13.

Stone, William C. et al., "Performance Analysis of Next-Generation LADAR for Manufacturing, Construction, and Mobility", NIST Publication No. NISTIR 7117, May 2004, 198 pages.

Hecht, Eugene, Optics, 4th Ed. 2002, 9 pages.

Richmond, Richard D. et al., "Direct-Detection LADAR Systems" SPIE PRESS / Tutorial Text in Optical Engineering, vol. TT85, 2010, Fig. 1.1(a), 40 pages.

Sun, H., "Chapter 2 Laser Diode Beam Basics", A Practical Guide to Handling Laser Diode Beams, SpringerBriefs in Physics, DOI, 10.1007/978-94-017-9783-2_2, 2015, 26 pages.

Clifford, S.F. et al., "Monostatic Diffraction-Limited Lidars: The Impact of Optical Refractive Turbulence", Applied Optics, vol. 22, No. 11, Jun. 1, 1983, pp. 1696-1701.

Molebny, Vasyl et al., "Laser Radar: Historical Prospective—From the East to the West", Optical Engineering, vol. 56, No. 3, Mar. 2017, 25 pages.

Brock, John et al., "Airborne Topographic Lidar Mapping for Coastal Science and Resource Management", USGS Open-File Report 01-46, 2001, 2 pages.

Urmson, Chris et al., "Autonomous Driving in Urban Environments: Boss and the Urban Challenge", Journal of Field Robotics, vol. 25, No. 8, 2008, pp. 425-466.

Stewart, Jack, "Tesla's Self-Driving Car Plan Seems Insane, But It Just Might Work", https://www.wired.com/2016/10/teslas-self-driving-car-plan-seems-insane-just-might-work, Oct. 24, 2016, 10 pages.

"LiDAR: Driving the Future of Autonomous Navigation", Frost & Sullivan, 2016, 30 pages.

IBEO LUX data sheet, http://www.abott-mf.com/pdf/ibeo%20LUX%20data%20sheet001.pdf, 2009, 2 pages.

Hall, David et al., "Team DAD Technical Paper", http://archive.darpa.mil/grandchallenge05/TechPapers/TeamDAD.pdf, Aug. 26, 2005, 12 pages.

"HDL-64E—All the Distance Sensing Data You Will Ever Need", http://Velodynelidar.com/hdl-64e.html, Apr. 11, 2017, 3 pages.

"HDL-64E Resource Manual", Velodyne, http://velodynelidar.com/lidar/products/manual/HDLResource%20Manual_lowres.pdf, Nov. 9, 2007, 71 pages.

Baker, David R., "New San Jose Lidar Plant Has Room to Grow", San Francisco Chron., Jan. 18, 2017, 1 page.

"Velodyne LiDAR HDL-64E, High Definition Real-Time 3D LiDAR", http://velodynelidar.com/docs/datasheet/63-9194_Rev-F_HDL-64E_S3_Data%20Sheet_Web.pdf, 2017, 2 pages.

"Uber Technology Tutorial", *Waymo LLC* v. *Uber Technologies, Inc.* et al., Apr. 12, 2017, 44 pages.

"Waymo's Technology Tutorial", *Waymo LLC* v. *Uber Technologies, Inc.* et al., Civil Action No. 3:17-cv-00939, Apr. 12, 2017, 64 pages.

Liero, Armin et al., "Laser Driver Switching 20 A With 2 ns Pulse Width Using GaN", 2010 IEEE MTT-S International Microwave Symposium Digest (MTT), May 23-28, 2010, pp. 1110-1113.

*Waymo LLC* v. *Uber Technologies, Inc., Ottomotto LLC and Otto Trucking LLC*, "Uber Technologies, Inc. and Ottomotto LLC's Invalidity Contentions Pursuant to Patent L.R. 3-3 and 3-4," Case No. 3:17-cv-00939-WHA, Jun. 2, 2017, 19 pages.

*Waymo LLC* v. *Uber Technologies, Inc., Ottomotto LLC and Otto Trucking LLC*, "Uber Technologies, Inc. and Ottomotto LLC's Invalidity Contentions Pursuant to Patent L.R. 3-3 and 3-4," Case No. 3:17-cv-00939-WHA, Exhibits 11, 12, 13, 14 and 15, Jun. 2, 2017, 94 pages.

(56) References Cited

OTHER PUBLICATIONS

*Waymo LLC* v. *Uber Technologies, Inc., Ottomotto LLC and Otto Trucking LLC*, "Uber Technologies, Inc. and Ottomotto LLC's Invalidity Contentions Pursuant to Patent L.R. 3-3 and 3-4," Case No. 3:17-cv-00939-WHA, Appendix of Patents and Publications to U.S. Pat. No. 9,368,936, Jun. 2, 2017, 2 pages.
Lidow et al., "GaN Transistors for Efficient Power Conversion," First Edition, 2012, Cover, Table of Contents, Chapters 1,3, and 14. Printed Copy of webpage https://amazon.com/GaN-Transistors-Efficient-Power-Conversion/dp/0615569250.
Reexamination Control No. 90/020, 113, Request for Ex Parte Reexamination of U.S. Pat. No. 9,368,936, dated Jul. 31, 2017.
Reexamination Control No. 90/020,113, Order Granting Ex Parte Reexamination of U.S. Pat. No. 9,368,936, dated Sep. 15, 2017.
*Waymo LLC* v. *Uber Technologies, Inc., Ottomotto LLC and Otto Trucking LLC*, "Plaintiff Waymo LLC's Opening Claim Construction Brief," Case No. 3:17-cv-00939, Aug. 7, 2017, 85 pages.
*Waymo LLC* v. *Uber Technologies, Inc., Ottomotto LLC and Otto Trucking LLC*, "Defendants Uber Technologies, Inc. and Ottomotto LLC's Rebuttal Claim Construction Brief,", Case No. 3:17-cv-00939, Aug. 16, 2017, 94 pages.
*Waymo LLC* v. *Uber Technologies, Inc., Ottomotto LLC and Otto Trucking LLC*, "Plaintiff Waymo LLC's Reply Claim Construction Brief," Case No. 3:17-cv-00939, Aug. 23, 2017, 54 pages.
*Waymo LLC* v. *Uber Technologies, Inc., Ottomotto LLC and Otto Trucking LLC*, "Expert Report of Dr. Philip Hobbs on Invalidity of U.S. Pat. No. 9,368,936," Case No. 3:17-cv-00939-WHA, Aug. 24, 2017, 145 pages.
*Waymo LLC* v. *Uber Technologies, Inc., Ottomotto LLC and Otto Trucking LLC*, "Rebuttal Expert Report of Dr. Andrew Wolfe, Ph.D. Concerning Validity of U.S. Pat. No. 9,368,936," Case No. 3:17-cv-00939, Sep. 7, 2017, 69 pages.
*Waymo LLC* v. *Uber Technologies, Inc., Ottomotto LLC and Otto Trucking LLC*, "Plaintiff's Objections and Responses to Uber's Second Set of Interrogatories (No. 12)," Case No. 3:17-cv-00939-JCS, Jul. 3, 2017, pp. 1-4 and 13-35.
Reexamination Control No. 90/020,113, Office Action dated Dec. 18, 2017.
Reexamination Control No. 90/020,113, Response to Office Action, filed Feb. 16, 2018.
Reexamination Control No. 90/020,113, Office Action dated Mar. 27, 2018.
Reexamination Control No. 90/020,113, Response to Office Action, filed May 29, 2018.
Reexamination Control No. 90/020,113, Notice of Defective Paper in Ex Parte Reexamination, mailed Jun. 19, 2018.
Reexamination Control No. 90/020,113, Supplemental Amendment and Response to Non-Final Office Action, filed Jul. 19, 2018.
Reexamination Control No. 90/020,113, Notice of Defective Paper in Ex Parte Reexamination, mailed Aug. 2, 2018.
Reexamination Control No. 90/020,113, Supplemental Amendment and Response to Non-Final Office Action, dated Aug. 21, 2018.
Reexamination Control No. 90/020,113, Final Office Action, dated Sep. 12, 2018.
Reexamination Control No. 90/020,113, Amendment and Response to Final Office Action, dated Nov. 8, 2018.
Reexamination Control No. 90/020,113, Notice of Intent to Issue Ex Parte Reexamination Certificate, mailed Dec. 4, 2018.

\* cited by examiner

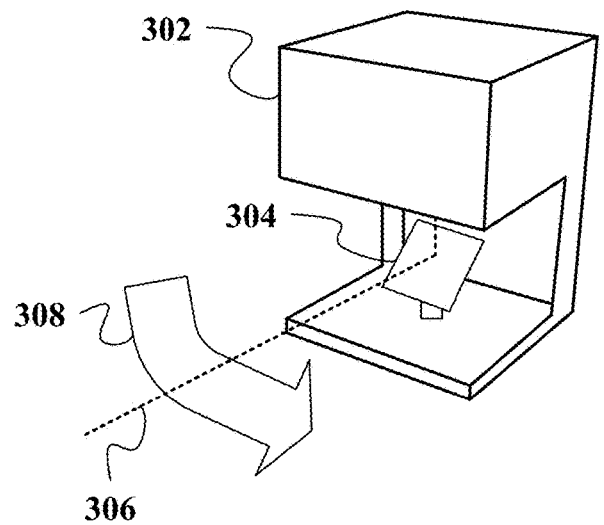
FIG. 3A
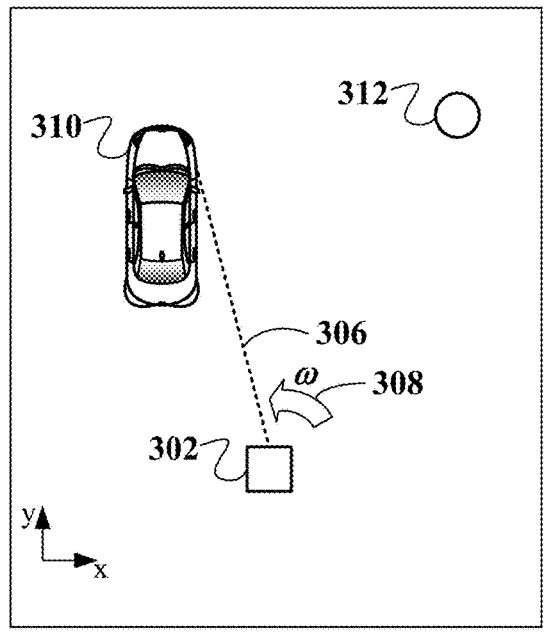 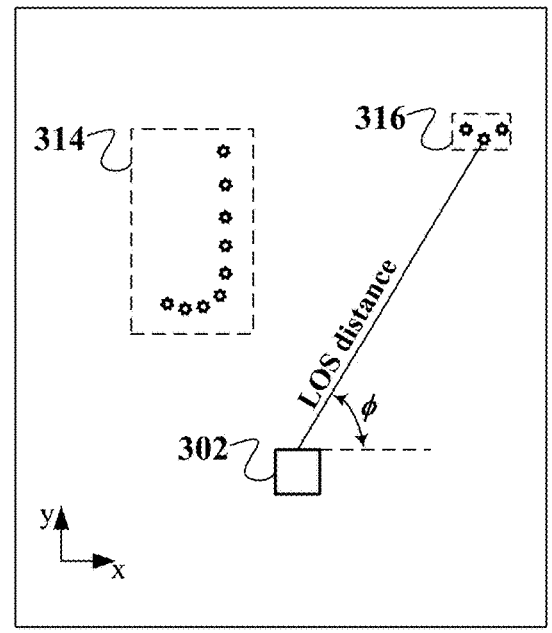
FIG. 3B          FIG. 3C

LASER DIODE FIRING SYSTEM

CROSS-REFERENCE TO RELATED APPLICATIONS

This application is a continuation of U.S. patent application Ser. No. 16/356,575, filed Mar. 18, 2019, which is a continuation of U.S. patent application Ser. No. 15/157,578, filed May 18, 2016 and issued on Apr. 30, 2019 as U.S. Pat. No. 10,277,007, which is a continuation of U.S. patent application Ser. No. 14/132,219, filed Dec. 18, 2013 and issued on Jun. 14, 2016 as U.S. Pat. No. 9,368,936, which claims priority to U.S. Provisional Patent Application No. 61/884,762, filed Sep. 30, 2013. Each of the foregoing applications and patents is incorporated herein by reference in its entirety and for all purposes. Each of U.S. patent application Ser. No. 16/394,627, filed Apr. 25, 2019; U.S. patent application Ser. No. 15/416,818, filed Jan. 26, 2017; U.S. Pat. No. 10,141,716, issued Nov. 27, 2018; and U.S. Pat. No. 10,581,221, issued Mar. 3, 2020, is also incorporated herein by reference in its entirety and for all purposes.

BACKGROUND

Unless otherwise indicated herein, the materials described in this section are not prior art to the claims in this application and are not admitted to be prior art by inclusion in this section.

Vehicles can be configured to operate in an autonomous mode in which the vehicle navigates through an environment with little or no input from a driver. Such autonomous vehicles can include one or more sensors that are configured to detect information about the environment in which the vehicle operates. The vehicle and its associated computer-implemented controller use the detected information to navigate through the environment. For example, if the sensor(s) detect that the vehicle is approaching an obstacle, as determined by the computer-implemented controller, the controller adjusts the vehicle's directional controls to cause the vehicle to navigate around the obstacle.

One such sensor is a light detection and ranging (LIDAR) device. A LIDAR actively estimates distances to environmental features while scanning through a scene to assemble a cloud of point positions indicative of the three-dimensional shape of the environmental scene. Individual points are measured by generating a laser pulse and detecting a returning pulse, if any, reflected from an environmental object, and determining the distance to the reflective object according to the time delay between the emitted pulse and the reception of the reflected pulse. The laser, or set of lasers, can be rapidly and repeatedly scanned across a scene to provide continuous real-time information on distances to reflective objects in the scene. Combining the measured distances and the orientation of the laser(s) while measuring each distance allows for associating a three-dimensional position with each returning pulse. A three-dimensional map of points of reflective features is generated based on the returning pulses for the entire scanning zone. The three-dimensional point map thereby indicates positions of reflective objects in the scanned scene.

SUMMARY

A laser diode firing circuit for a light detection and ranging (LIDAR) device is disclosed. The firing circuit includes a laser diode coupled in series with a transistor, such that current through the laser diode is controlled by the transistor. The laser diode is configured to emit a pulse of light in response to current flowing through the laser diode. A capacitor is connected across the laser diode and the transistor such that the capacitor discharges through the laser diode when the transistor is turned on. The capacitor is charged by a voltage source via a charging path that includes a diode and an inductor. The inductor has one terminal coupled to the voltage source and another terminal coupled to the anode of the diode, and the cathode of the diode is coupled to the capacitor. As a result, the capacitor is only charged while the diode is forward biased. Upon turning on the transistor, the capacitor discharges through the laser diode and a pulse of light is emitted. Once the capacitor discharges to a voltage level sufficient to forward bias the diode, current begins flowing through the inductor. The increase in inductor current causes the inductor to increase energy stored in its magnetic field, and drives the voltage applied to the anode of the diode lower than the voltage source. Once the transistor is turned off, the laser diode ceases emission, and the current through the inductor is directed to recharge the capacitor, which causes the inductor current to begin decreasing. The sudden change in current through the inductor causes an increase in the voltage applied to the anode of the diode. The capacitor is charged until the voltage of the capacitor approximately matches the voltage at the diode anode, at which point the diode becomes reverse biased. Upon reverse biasing the diode, the current through the inductor goes to zero and the charging cycle is complete. Both the emission and charging operations of the firing circuit can thus be controlled by operation of the single transistor.

Some embodiments of the present disclosure provide an apparatus. The apparatus includes a voltage source, an inductor, a diode, a transistor, a light emitting element, and a capacitor. The inductor can be coupled to the voltage source. The inductor can be configured to store energy in a magnetic field. The diode can be coupled to the voltage source via the inductor. The transistor can be configured to be turned on and turned off by a control signal. The light emitting element can be coupled to the transistor. The capacitor can be coupled to a charging path and a discharge path. The charging path can include the inductor and the diode. The discharge path can include the transistor and the light emitting element. The capacitor can be configured to charge via the charging path such that a voltage across the capacitor increases from a lower voltage level to a higher voltage level responsive to the transistor being turned off. The inductor can be configured to release energy stored in the magnetic field such that a current through the inductor decreases from a higher current level to a lower current level responsive to the transistor being turned off. The capacitor can be configured to discharge through the discharge path such that the light emitting element emits a pulse of light and the voltage across the capacitor decreases from the higher voltage level to the lower voltage level responsive to the transistor being turned on. The inductor can be configured to store energy in the magnetic field such that the current through the inductor increases from the lower current level to the higher current level responsive to the transistor being turned on.

Some embodiments of the present disclosure provide a method. The method can include turning off a transistor and turning on a transistor. The transistor can be coupled to a light emitting element. Both the transistor and the light emitting element can be included in a discharge path coupled to a capacitor. The capacitor can also be coupled to a charging path including a diode and an inductor. The inductor can be configured to store energy in a magnetic field. The diode can be coupled to a voltage source via the inductor. The capacitor can be configured to charge via the charging path such that a voltage across the capacitor increases from a lower voltage level to a higher voltage level responsive to the transistor being turned off. The inductor can be configured to release energy stored in the magnetic field such that a current through the inductor decreases from a higher current level to a lower current level responsive to the transistor being turned off. The capacitor can be configured to discharge through the discharge path such that the light emitting element emits a pulse of light and the voltage across the capacitor decreases from the higher voltage level to the lower voltage level responsive to the transistor being turned on. The inductor can be configured to store energy in the magnetic field such that the current through the inductor increases from the lower current level to the higher current level responsive to the transistor being turned on.

Some embodiments of the present disclosure provide a light detection and ranging (LIDAR) device. The LIDAR device can include a light source, a light sensor, and a controller. The light source can include a voltage source, an inductor, a diode, a transistor, a light emitting element, and a capacitor. The inductor can be coupled to the voltage source. The inductor can be configured to store energy in a magnetic field. The diode can be coupled to the voltage source via the inductor. The transistor can be configured to be turned on and turned off by a control signal. The light emitting element can be coupled to the transistor. The capacitor can be coupled to a charging path and a discharge path. The charging path includes the inductor and the diode. The discharge path includes the transistor and the light emitting element. The capacitor can be configured to charge via the charging path such that a voltage across the capacitor increases from a lower voltage level to a higher voltage level responsive to the transistor being turned off. The inductor can be configured to release energy stored in the magnetic field such that a current through the inductor decreases from a higher current level to a lower current level responsive to the transistor being turned off. The capacitor can be configured to discharge through the discharge path such that the light emitting element emits a pulse of light and the voltage across the capacitor decreases from the higher voltage level to the lower voltage level responsive to the transistor being turned on. The inductor can be configured to store energy in the magnetic field such that the current through the inductor increases from the lower current level to the higher current level responsive to the transistor being turned on. The light sensor can be configured to detect a reflected light signal comprising light from the emitted light pulse reflected by a reflective object. The controller can be configured to determine a distance to the reflective object based on the reflected light signal.

Some embodiments of the present disclosure provide a means for controlling a laser diode firing circuit to operate in an emission mode and a charging mode using a single transistor. Embodiments may include means turning off a transistor and turning on a transistor. The transistor can be coupled to a light emitting element. Both the transistor and the light emitting element can be included in a discharge path coupled to a capacitor. The capacitor can also be coupled to a charging path including a diode and an inductor. The inductor can be configured to store energy in a magnetic field. The diode can be coupled to a voltage source via the inductor. The capacitor can be configured to charge via the charging path such that a voltage across the capacitor increases from a lower voltage level to a higher voltage level responsive to the transistor being turned off. The inductor can be configured to release energy stored in the magnetic field such that a current through the inductor decreases from a higher current level to a lower current level responsive to the transistor being turned off. The capacitor can be configured to discharge through the discharge path such that the light emitting element emits a pulse of light and the voltage across the capacitor decreases from the higher voltage level to the lower voltage level responsive to the transistor being turned on. The inductor can be configured to store energy in the magnetic field such that the current through the inductor increases from the lower current level to the higher current level responsive to the transistor being turned on.

These as well as other aspects, advantages, and alternatives, will become apparent to those of ordinary skill in the art by reading the following detailed description, with reference where appropriate to the accompanying drawings.

BRIEF DESCRIPTION OF THE FIGURES

FIG. 3A provides an example depiction of a LIDAR device including beam steering optics.

FIG. 3B symbolically illustrates an example in which a LIDAR device scans across an obstacle-filled environmental scene.

FIG. 3C symbolically illustrates an example point cloud corresponding to the obstacle-filled environmental scene of FIG. 3B.

DETAILED DESCRIPTION

I. Overview

Figure 1:
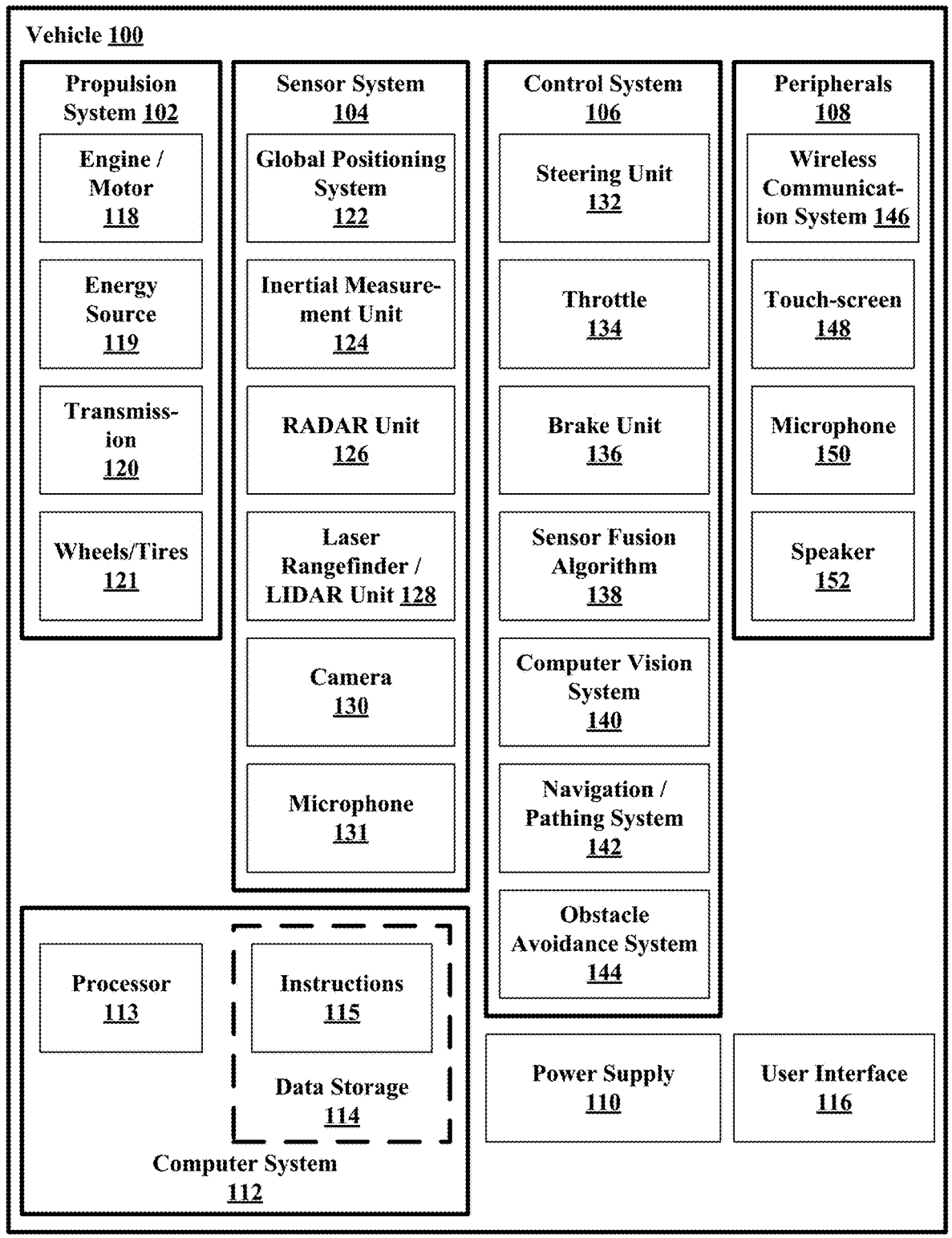
FIG. 1 is a functional block diagram depicting aspects of an example autonomous vehicle.

Example embodiments relate to an autonomous vehicle, such as a driverless automobile, that includes a light detection and ranging (LIDAR) sensor for actively detecting reflective features in the environment surrounding the vehicle. A controller analyzes information from the LIDAR sensor to identify the surroundings of the vehicle. The LIDAR sensor includes a light source that may include one or more laser diodes configured to emit pulses of light that are then directed to illuminate the environment surrounding the vehicle. Circuits for firing a laser diode and determining a pulse emission time from the laser diode are disclosed herein.

According to some embodiments, a LIDAR device includes one or more laser diode firing circuits in which a laser diode is connected in series to a transistor such that current through the laser diode is controlled by the transistor. A capacitor is coupled to a charging path and a discharge path. The discharge path includes the laser diode and the transistor such that turning on the transistor causes the capacitor to discharge through the laser diode, which causes the laser diode to emit a pulse of light.

The capacitor's charging path includes an inductor and a diode. The inductor is configured to store energy in a magnetic field, and is connected between a voltage source and the diode. An increasing inductor current charges the inductor by increasing the energy stored in the magnetic field of the inductor. The increasing current induces a voltage across the inductor, such that a voltage less than the voltage source is applied to the diode. A decreasing inductor current discharges the inductor by decreasing the energy stored in the magnetic field. The decreasing current induces a voltage across the inductor, such that the voltage applied to the diode exceeds the voltage source. The diode is also connected to the capacitor and is configured to be forward biased when the voltage across the capacitor does not exceed the voltage applied to the diode by the inductor (to thereby charge the capacitor). The diode is also configured to be reverse biased when the voltage across the capacitor exceeds the voltage applied to the diode by the inductor (to thereby prevent the capacitor from discharging).

In some embodiments, the firing circuit disclosed herein is configured to switch between a charging mode and an emission mode based on operation of a single transistor. In response to turning the transistor off, current through the laser diode ceases and emission of a pulse terminates. In response to turning off the transistor, if the charging path diode is forward biased, the capacitor begins recharging through the charging path. As charge accumulates on the capacitor the current through the charging path (and the inductor) decreases, and the decrease in inductor current causes the inductor to release energy stored in its magnetic field. The released energy from the inductor causes the voltage applied to the capacitor through the diode to exceed the voltage of the voltage source, at least transiently. The transient voltage is applied to the capacitor through the diode. The capacitor is therefore charged according to the transient voltage and then holds its charge level when the diode becomes reverse biased. Following a charging interval, the voltage charged across the capacitor can be greater than the voltage of the voltage source.

The laser diode can emit light in the visible spectrum, ultraviolet spectrum, infrared spectrum, near infrared spectrum, and/or infrared spectrum. In one example, the laser diode emits pulses of infrared light with a wavelength of about 905 nm. The transistor can be a Gallium nitride field effect transistor (FET), for example.

II. Example Autonomous Vehicle System

Some aspects of the example methods described herein may be carried out in whole or in part by an autonomous vehicle or components thereof. However, some example methods may also be carried out in whole or in part by a system or systems that are remote from an autonomous vehicle. For instance, an example method could be carried out in part or in full by a server system, which receives information from sensors (e.g., raw sensor data and/or information derived therefrom) of an autonomous vehicle. Other examples are also possible.

Example systems within the scope of the present disclosure will now be described in greater detail. An example system may be implemented in, or may take the form of, an automobile. However, an example system may also be implemented in or take the form of other vehicles, such as cars, trucks, motorcycles, buses, boats, airplanes, helicopters, lawn mowers, earth movers, boats, snowmobiles, aircraft, recreational vehicles, amusement park vehicles, farm equipment, construction equipment, trams, golf carts, trains, and trolleys. Other vehicles are possible as well.

FIG. 1 is a functional block diagram illustrating a vehicle 100 according to an example embodiment. The vehicle 100 is configured to operate fully or partially in an autonomous mode, and thus may be referred to as an "autonomous vehicle." For example, a computer system 112 can control the vehicle 100 while in an autonomous mode via control instructions to a control system 106 for the vehicle 100. The computer system 112 can receive information from one or more sensor systems 104, and base one or more control processes (such as setting a heading so as to avoid a detected obstacle) upon the received information in an automated fashion.

The autonomous vehicle 100 can be fully autonomous or partially autonomous. In a partially autonomous vehicle some functions can optionally be manually controlled (e.g., by a driver) some or all of the time. Further, a partially autonomous vehicle can be configured to switch between a fully-manual operation mode and a partially-autonomous and/or a fully-autonomous operation mode.

The vehicle 100 includes a propulsion system 102, a sensor system 104, a control system 106, one or more peripherals 108, a power supply 110, a computer system 112, and a user interface 116. The vehicle 100 may include more or fewer subsystems and each subsystem can optionally include multiple components. Further, each of the subsystems and components of vehicle 100 can be interconnected and/or in communication. Thus, one or more of the functions of the vehicle 100 described herein can optionally be divided between additional functional or physical components, or combined into fewer functional or physical components. In some further examples, additional functional and/or physical components may be added to the examples illustrated by FIG. 1.

The propulsion system 102 can include components operable to provide powered motion to the vehicle 100. In some embodiments the propulsion system 102 includes an engine/motor 118, an energy source 119, a transmission 120, and wheels/tires 121. The engine/motor 118 converts energy source 119 to mechanical energy. In some embodiments, the propulsion system 102 can optionally include one or both of engines and/or motors. For example, a gas-electric hybrid vehicle can include both a gasoline/diesel engine and an electric motor.

The energy source 119 represents a source of energy, such as electrical and/or chemical energy, that may, in full or in part, power the engine/motor 118. That is, the engine/motor 118 can be configured to convert the energy source 119 to mechanical energy to operate the transmission. In some embodiments, the energy source 119 can include gasoline, diesel, other petroleum-based fuels, propane, other compressed gas-based fuels, ethanol, solar panels, batteries, capacitors, flywheels, regenerative braking systems, and/or other sources of electrical power, etc. The energy source 119 can also provide energy for other systems of the vehicle 100.

The transmission 120 includes appropriate gears and/or mechanical elements suitable to convey the mechanical power from the engine/motor 118 to the wheels/tires 121. In some embodiments, the transmission 120 includes a gearbox, a clutch, a differential, a drive shaft, and/or axle(s), etc.

The wheels/tires 121 are arranged to stably support the vehicle 100 while providing frictional traction with a surface, such as a road, upon which the vehicle 100 moves. Accordingly, the wheels/tires 121 are configured and arranged according to the nature of the vehicle 100. For example, the wheels/tires can be arranged as a unicycle, bicycle, motorcycle, tricycle, or car/truck four-wheel format. Other wheel/tire geometries are possible, such as those including six or more wheels. Any combination of the wheels/tires 121 of vehicle 100 may be operable to rotate differentially with respect to other wheels/tires 121. The wheels/tires 121 can optionally include at least one wheel that is rigidly attached to the transmission 120 and at least one tire coupled to a rim of a corresponding wheel that makes contact with a driving surface. The wheels/tires 121 may include any combination of metal and rubber, and/or other materials or combination of materials.

The sensor system 104 generally includes one or more sensors configured to detect information about the environment surrounding the vehicle 100. For example, the sensor system 104 can include a Global Positioning System (GPS) 122, an inertial measurement unit (IMU) 124, a RADAR unit 126, a laser rangefinder/LIDAR unit 128, a camera 130, and/or a microphone 131. The sensor system 104 could also include sensors configured to monitor internal systems of the vehicle 100 (e.g., 02 monitor, fuel gauge, engine oil temperature, wheel speed sensors, etc.). One or more of the sensors included in sensor system 104 could be configured to be actuated separately and/or collectively in order to modify a position and/or an orientation of the one or more sensors.

The GPS 122 is a sensor configured to estimate a geographic location of the vehicle 100. To this end, GPS 122 can include a transceiver operable to provide information regarding the position of the vehicle 100 with respect to the Earth.

The IMU 124 can include any combination of sensors (e.g., accelerometers and gyroscopes) configured to sense position and orientation changes of the vehicle 100 based on inertial acceleration.

The RADAR unit 126 can represent a system that utilizes radio signals to sense objects within the local environment of the vehicle 100. In some embodiments, in addition to sensing the objects, the RADAR unit 126 and/or the computer system 112 can additionally be configured to sense the speed and/or heading of the objects.

Similarly, the laser rangefinder or LIDAR unit 128 can be any sensor configured to sense objects in the environment in which the vehicle 100 is located using lasers. The laser rangefinder/LIDAR unit 128 can include one or more laser sources, a laser scanner, and one or more detectors, among other system components. The laser rangefinder/LIDAR unit 128 can be configured to operate in a coherent (e.g., using heterodyne detection) or an incoherent detection mode.

The camera 130 can include one or more devices configured to capture a plurality of images of the environment surrounding the vehicle 100. The camera 130 can be a still camera or a video camera. In some embodiments, the camera 130 can be mechanically movable such as by rotating and/or tilting a platform to which the camera is mounted. As such, a control process of vehicle 100 may be implemented to control the movement of camera 130.

The sensor system 104 can also include a microphone 131. The microphone 131 can be configured to capture sound from the environment surrounding vehicle 100. In some cases, multiple microphones can be arranged as a microphone array, or possibly as multiple microphone arrays.

The control system 106 is configured to control operation(s) regulating acceleration of the vehicle 100 and its components. To effect acceleration, the control system 106 includes a steering unit 132, throttle 134, brake unit 136, a sensor fusion algorithm 138, a computer vision system 140, a navigation/pathing system 142, and/or an obstacle avoidance system 144, etc.

The steering unit 132 is operable to adjust the heading of vehicle 100. For example, the steering unit can adjust the axis (or axes) of one or more of the wheels/tires 121 so as to effect turning of the vehicle. The throttle 134 is configured to control, for instance, the operating speed of the engine/motor 118 and, in turn, adjust forward acceleration of the vehicle 100 via the transmission 120 and wheels/tires 121. The brake unit 136 decelerates the vehicle 100. The brake unit 136 can use friction to slow the wheels/tires 121. In some embodiments, the brake unit 136 inductively decelerates the wheels/tires 121 by a regenerative braking process to convert kinetic energy of the wheels/tires 121 to electric current.

The sensor fusion algorithm 138 is an algorithm (or a computer program product storing an algorithm) configured to accept data from the sensor system 104 as an input. The data may include, for example, data representing information sensed at the sensors of the sensor system 104. The sensor fusion algorithm 138 can include, for example, a Kalman filter, Bayesian network, etc. The sensor fusion algorithm 138 provides assessments regarding the environment surrounding the vehicle based on the data from sensor system 104. In some embodiments, the assessments can include evaluations of individual objects and/or features in the environment surrounding vehicle 100, evaluations of particular situations, and/or evaluations of possible interference between the vehicle 100 and features in the environment (e.g., such as predicting collisions and/or impacts) based on the particular situations.

The computer vision system 140 can process and analyze images captured by camera 130 to identify objects and/or features in the environment surrounding vehicle 100. The detected features/objects can include traffic signals, road way boundaries, other vehicles, pedestrians, and/or obstacles, etc. The computer vision system 140 can optionally employ an object recognition algorithm, a Structure From Motion (SFM) algorithm, video tracking, and/or available computer vision techniques to effect categorization and/or identification of detected features/objects. In some embodiments, the computer vision system 140 can be additionally configured to map the environment, track perceived objects, estimate the speed of objects, etc.

The navigation and pathing system 142 is configured to determine a driving path for the vehicle 100. For example, the navigation and pathing system 142 can determine a series of speeds and directional headings to effect movement of the vehicle along a path that substantially avoids perceived obstacles while generally advancing the vehicle along a roadway-based path leading to an ultimate destination, which can be set according to user inputs via the user interface 116, for example. The navigation and pathing system 142 can additionally be configured to update the driving path dynamically while the vehicle 100 is in operation on the basis of perceived obstacles, traffic patterns, weather/road conditions, etc. In some embodiments, the navigation and pathing system 142 can be configured to incorporate data from the sensor fusion algorithm 138, the GPS 122, and one or more predetermined maps so as to determine the driving path for vehicle 100.

The obstacle avoidance system 144 can represent a control system configured to identify, evaluate, and avoid or otherwise negotiate potential obstacles in the environment surrounding the vehicle 100. For example, the obstacle avoidance system 144 can effect changes in the navigation of the vehicle by operating one or more subsystems in the control system 106 to undertake swerving maneuvers, turning maneuvers, braking maneuvers, etc. In some embodiments, the obstacle avoidance system 144 is configured to automatically determine feasible ("available") obstacle avoidance maneuvers on the basis of surrounding traffic patterns, road conditions, etc. For example, the obstacle avoidance system 144 can be configured such that a swerving maneuver is not undertaken when other sensor systems detect vehicles, construction barriers, other obstacles, etc. in the region adjacent the vehicle that would be swerved into. In some embodiments, the obstacle avoidance system 144 can automatically select the maneuver that is both available and maximizes safety of occupants of the vehicle. For example, the obstacle avoidance system 144 can select an avoidance maneuver predicted to cause the least amount of acceleration in a passenger cabin of the vehicle 100.

The vehicle 100 also includes peripherals 108 configured to allow interaction between the vehicle 100 and external sensors, other vehicles, other computer systems, and/or a user, such as an occupant of the vehicle 100. For example, the peripherals 108 for receiving information from occupants, external systems, etc. can include a wireless communication system 146, a touchscreen 148, a microphone 150, and/or a speaker 152.

In some embodiments, the peripherals 108 function to receive inputs for a user of the vehicle 100 to interact with the user interface 116. To this end, the touchscreen 148 can both provide information to a user of vehicle 100, and convey information from the user indicated via the touchscreen 148 to the user interface 116. The touchscreen 148 can be configured to sense both touch positions and touch gestures from a user's finger (or stylus, etc.) via capacitive sensing, resistance sensing, optical sensing, a surface acoustic wave process, etc. The touchscreen 148 can be capable of sensing finger movement in a direction parallel or planar to the touchscreen surface, in a direction normal to the touchscreen surface, or both, and may also be capable of sensing a level of pressure applied to the touchscreen surface. An occupant of the vehicle 100 can also utilize a voice command interface. For example, the microphone 150 can be configured to receive audio (e.g., a voice command or other audio input) from a user of the vehicle 100. Similarly, the speakers 152 can be configured to output audio to the user of the vehicle 100.

In some embodiments, the peripherals 108 function to allow communication between the vehicle 100 and external systems, such as devices, sensors, other vehicles, etc. within its surrounding environment and/or controllers, servers, etc., physically located far from the vehicle that provide useful information regarding the vehicle's surroundings, such as traffic information, weather information, etc. For example, the wireless communication system 146 can wirelessly communicate with one or more devices directly or via a communication network. The wireless communication system 146 can optionally use 3G cellular communication, such as CDMA, EVDO, GSM/GPRS, and/or 4G cellular communication, such as WiMAX or LTE. Additionally or alternatively, wireless communication system 146 can communicate with a wireless local area network (WLAN), for example, using WiFi. In some embodiments, wireless communication system 146 could communicate directly with a device, for example, using an infrared link, Bluetooth, and/or ZigBee. The wireless communication system 146 can include one or more dedicated short range communication (DSRC) devices that can include public and/or private data communications between vehicles and/or roadside stations. Other wireless protocols for sending and receiving information embedded in signals, such as various vehicular communication systems, can also be employed by the wireless communication system 146 within the context of the present disclosure.

As noted above, the power supply 110 can provide power to components of vehicle 100, such as electronics in the peripherals 108, computer system 112, sensor system 104, etc. The power supply 110 can include a rechargeable lithium-ion or lead-acid battery for storing and discharging electrical energy to the various powered components, for example. In some embodiments, one or more banks of batteries can be configured to provide electrical power. In some embodiments, the power supply 110 and energy source 119 can be implemented together, as in some all-electric cars.

Many or all of the functions of vehicle 100 can be controlled via computer system 112 that receives inputs from the sensor system 104, peripherals 108, etc., and communicates appropriate control signals to the propulsion system 102, control system 106, peripherals, etc. to effect automatic operation of the vehicle 100 based on its surroundings. Computer system 112 includes at least one processor 113 (which can include at least one microprocessor) that executes instructions 115 stored in a non-transitory computer readable medium, such as the data storage 114. The computer system 112 may also represent a plurality of computing devices that serve to control individual components or subsystems of the vehicle 100 in a distributed fashion.

In some embodiments, data storage 114 contains instructions 115 (e.g., program logic) executable by the processor 113 to execute various functions of vehicle 100, including those described above in connection with FIG. 1. Data storage 114 may contain additional instructions as well, including instructions to transmit data to, receive data from, interact with, and/or control one or more of the propulsion system 102, the sensor system 104, the control system 106, and the peripherals 108.

In addition to the instructions 115, the data storage 114 may store data such as roadway maps, path information, among other information. Such information may be used by vehicle 100 and computer system 112 during operation of the vehicle 100 in the autonomous, semi-autonomous, and/or manual modes to select available roadways to an ultimate destination, interpret information from the sensor system 104, etc.

The vehicle 100, and associated computer system 112, provides information to and/or receives input from, a user of vehicle 100, such as an occupant in a passenger cabin of the vehicle 100. The user interface 116 can accordingly include one or more input/output devices within the set of peripherals 108, such as the wireless communication system 146, the touchscreen 148, the microphone 150, and/or the speaker 152 to allow communication between the computer system 112 and a vehicle occupant.

The computer system 112 controls the operation of the vehicle 100 based on inputs received from various subsystems indicating vehicle and/or environmental conditions (e.g., propulsion system 102, sensor system 104, and/or control system 106), as well as inputs from the user interface 116, indicating user preferences. For example, the computer system 112 can utilize input from the control system 106 to control the steering unit 132 to avoid an obstacle detected by the sensor system 104 and the obstacle avoidance system 144. The computer system 112 can be configured to control many aspects of the vehicle 100 and its subsystems. Generally, however, provisions are made for manually overriding automated controller-driven operation, such as in the event of an emergency, or merely in response to a user-activated override, etc.

The components of vehicle 100 described herein can be configured to work in an interconnected fashion with other components within or outside their respective systems. For example, the camera 130 can capture a plurality of images that represent information about an environment of the vehicle 100 while operating in an autonomous mode. The environment may include other vehicles, traffic lights, traffic signs, road markers, pedestrians, etc. The computer vision system 140 can categorize and/or recognize various aspects in the environment in concert with the sensor fusion algorithm 138, the computer system 112, etc. based on object recognition models pre-stored in data storage 114, and/or by other techniques.

Although the vehicle 100 is described and shown in FIG. 1 as having various components of vehicle 100, e.g., wireless communication system 146, computer system 112, data storage 114, and user interface 116, integrated into the vehicle 100, one or more of these components can optionally be mounted or associated separately from the vehicle 100. For example, data storage 114 can exist, in part or in full, separate from the vehicle 100, such as in a cloud-based server, for example. Thus, one or more of the functional elements of the vehicle 100 can be implemented in the form of device elements located separately or together. The functional device elements that make up vehicle 100 can generally be communicatively coupled together in a wired and/or wireless fashion.

Figure 2:
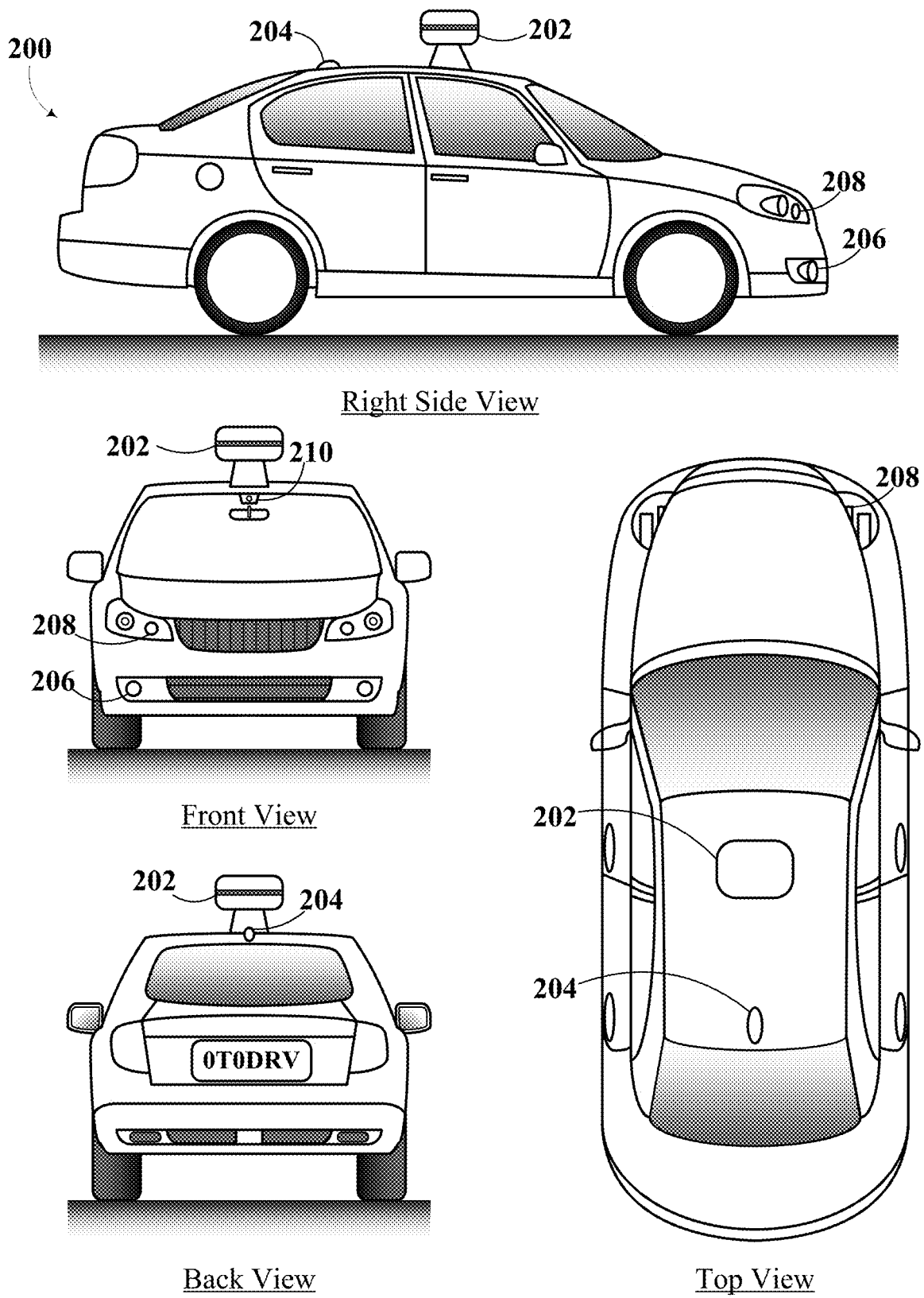
FIG. 2 depicts exterior views of an example autonomous vehicle.

FIG. 2 shows an example vehicle 200 that can include some or all of the functions described in connection with vehicle 100 in reference to FIG. 1. Although vehicle 200 is illustrated in FIG. 2 as a four-wheel sedan-type car for illustrative purposes, the present disclosure is not so limited. For instance, the vehicle 200 can represent a truck, a van, a semi-trailer truck, a motorcycle, a golf cart, an off-road vehicle, or a farm vehicle, etc.

The example vehicle 200 includes a sensor unit 202, a wireless communication system 204, a RADAR unit 206, a laser rangefinder unit 208, and a camera 210. Furthermore, the example vehicle 200 can include any of the components described in connection with vehicle 100 of FIG. 1. The RADAR unit 206 and/or laser rangefinder unit 208 can actively scan the surrounding environment for the presence of potential obstacles and can be similar to the RADAR unit 126 and/or laser rangefinder/LIDAR unit 128 in the vehicle 100.

The sensor unit 202 is mounted atop the vehicle 200 and includes one or more sensors configured to detect information about an environment surrounding the vehicle 200, and output indications of the information. For example, sensor unit 202 can include any combination of cameras, RADARs, LIDARs, range finders, and acoustic sensors. The sensor unit 202 can include one or more movable mounts that could be operable to adjust the orientation of one or more sensors in the sensor unit 202. In one embodiment, the movable mount could include a rotating platform that could scan sensors so as to obtain information from each direction around the vehicle 200. In another embodiment, the movable mount of the sensor unit 202 could be moveable in a scanning fashion within a particular range of angles and/or azimuths. The sensor unit 202 could be mounted atop the roof of a car, for instance, however other mounting locations are possible. Additionally, the sensors of sensor unit 202 could be distributed in different locations and need not be collocated in a single location. Some possible sensor types and mounting locations include RADAR unit 206 and laser rangefinder unit 208. Furthermore, each sensor of sensor unit 202 can be configured to be moved or scanned independently of other sensors of sensor unit 202.

In an example configuration, one or more RADAR scanners (e.g., the RADAR unit 206) can be located near the front of the vehicle 200, to actively scan the region in front of the car 200 for the presence of radio-reflective objects. A RADAR scanner can be situated, for example, in a location suitable to illuminate a region including a forward-moving path of the vehicle 200 without occlusion by other features of the vehicle 200. For example, a RADAR scanner can be situated to be embedded and/or mounted in or near the front bumper, front headlights, cowl, and/or hood, etc. Furthermore, one or more additional RADAR scanning devices can be located to actively scan the side and/or rear of the vehicle 200 for the presence of radio-reflective objects, such as by including such devices in or near the rear bumper, side panels, rocker panels, and/or undercarriage, etc.

The wireless communication system 204 could be located on a roof of the vehicle 200 as depicted in FIG. 2. Alternatively, the wireless communication system 204 could be located, fully or in part, elsewhere. The wireless communication system 204 may include wireless transmitters and receivers that could be configured to communicate with devices external or internal to the vehicle 200. Specifically, the wireless communication system 204 could include transceivers configured to communicate with other vehicles and/or computing devices, for instance, in a vehicular communication system or a roadway station. Examples of such vehicular communication systems include dedicated short range communications (DSRC), radio frequency identification (RFID), and other proposed communication standards directed towards intelligent transport systems.

The camera 210 can be a photo-sensitive instrument, such as a still camera, a video camera, etc., that is configured to capture a plurality of images of the environment of the vehicle 200. To this end, the camera 210 can be configured to detect visible light, and can additionally or alternatively be configured to detect light from other portions of the spectrum, such as infrared or ultraviolet light. The camera 210 can be a two-dimensional detector, and can optionally have a three-dimensional spatial range of sensitivity. In some embodiments, the camera 210 can include, for example, a range detector configured to generate a two-dimensional image indicating distance from the camera 210 to a number of points in the environment. To this end, the camera 210 may use one or more range detecting techniques.

For example, the camera 210 can provide range information by using a structured light technique in which the vehicle 200 illuminates an object in the environment with a predetermined light pattern, such as a grid or checkerboard pattern and uses the camera 210 to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements.

The camera 210 can be mounted inside a front windshield of the vehicle 200. Specifically, the camera 210 can be situated to capture images from a forward-looking view with respect to the orientation of the vehicle 200. Other mounting locations and viewing angles of camera 210 can also be used, either inside or outside the vehicle 200.

The camera 210 can have associated optics operable to provide an adjustable field of view. Further, the camera 210 can be mounted to vehicle 200 with a movable mount to vary a pointing angle of the camera 210, such as via a pan/tilt mechanism.

III. Example LIDAR Device

An example light detection and ranging (LIDAR) device operates to estimate positions of reflective objects surrounding the device by illuminating its surrounding environment with pulses of light and measuring the reflected signals. An example LIDAR device may include a light source, beam-steering optics, a light sensor, and a controller. The light source may emit pulses of light toward the beam-steering optics, which directs the pulses of light across a scanning zone. Reflective features in the scanning zone reflect the emitted pulses of light and the reflected light signals can be detected by the light sensor. The controller can regulate the operation of the light source and beam-steering optics to scan pulses of light across the scanning zone. The controller can also be configured to estimate positions of reflective features in the scanning zone based on the reflected signals detected by the light sensor. For example, the controller can measure the time delay between emission of a pulse of light and reception of a reflected light signal and determine the distance to the reflective feature based on the time of flight of a round trip to the reflective feature. In addition, the controller may use the orientation of the beam-steering optics at the time the pulse of light is emitted to estimate a direction toward the reflective feature. The estimated direction and estimated distance can then be combined to estimate a three-dimensional position of the reflective object relative to the LIDAR device.

FIG. 3A provides an example depiction of a LIDAR device 302 including beam steering optics 304. A laser beam 306 is directed to the beam steering optics 304. In the example illustrated in FIG. 3A, the beam steering optics 304 is a rotating angled mirror that directs the laser beam 306 to sweep across a scanning zone. The beam steering optics 304 may include a combination of lenses, mirrors, and/or apertures configured to direct the laser beam to sweep across a scanning zone, and are interchangeably described as the rotating angled mirror 304. The rotating angled mirror 304 rotates about an axis substantially parallel, and roughly in line with, the initial downward path of the laser beam 306. The rotating angled mirror 304 rotates in the direction indicated by the reference arrow 308 in FIG. 3A.

Although rangefinder 302 is depicted as having an approximately 180 degree range of rotation for the scanning zone of the laser beam 306 via the rotating angled mirror 304, this is for purposes of example and explanation only. LIDAR 302 can be configured to have viewing angles (e.g., angular range of available orientations during each sweep), including viewing angles up to and including 360 degrees. Further, although LIDAR 302 is depicted with the single laser beam 306 and a single mirror 304, this is for purposes of example and explanation only, LIDAR 302 can include multiple laser beams operating simultaneously or sequentially to provide greater sampling coverage of the surrounding environment. The LIDAR 302 also includes, or works in concert with, additional optical sensors (e.g., a photo-detector, not shown) configured to detect the reflection of laser beam 306 from features/objects in the surrounding environment with sufficient temporal sensitivity to determine distances to the reflective features. For example, with reference to the vehicle 200 in FIG. 2, such optical sensors can optionally be co-located with the top-mounted sensors 204 on the autonomous vehicle 200.

FIG. 3B symbolically illustrates the LIDAR device 302 scanning across an obstacle-filled environmental scene. The example vehicular environment depicted in FIG. 3B includes a car 310 and a tree 312. In operation, LIDAR 302 rotates according to motion reference arrow 308. While rotating, the LIDAR 302 regularly (e.g., periodically) emits laser pulses, such as the laser pulse 306. Objects in the surrounding environment, such as vehicle 310 and tree 312, reflect the emitted pulses and the resulting reflected signals are then received by suitable sensors. Precisely time-stamping the receipt of the reflected signals allows for associating each reflected signal (if any is received at all) with the most recently emitted laser pulse, and measuring the time delay between emission of the laser pulse and reception of the reflected light. The time delay provides an estimate of the distance to the reflective feature by scaling according to the speed of light in the intervening atmosphere. Combining the distance information for each reflected signal with the orientation of the LIDAR device 302 for the respective pulse emission allows for determining a position of the reflective feature in three-dimensions. For illustrative purposes, the environmental scene in FIG. 3B is described in the two-dimensional x-y plane in connection with a single sweep of the LIDAR device 302 that estimates positions to a series of points located in the x-y plane. However, it is noted that a more complete three-dimensional sampling is provided by either adjusting the beam steering optics 304 to direct the laser beam 306 up or down from the x-y plane on its next sweep of the scene or by providing additional lasers and associated beam steering optics dedicated to sampling point locations in planes above and below the x-y plane shown in FIG. 3B, or combinations of these techniques.

FIG. 3C symbolically illustrates a point cloud corresponding to the obstacle-filled environmental scene of FIG. 3B. Spatial-point data (represented by stars) are shown from a ground-plane (or aerial) perspective. Even though the individual points are not equally spatially distributed throughout the sampled environment, adjacent sampled points are roughly equally angularly spaced with respect to the LIDAR device 302. A cluster of points referred to herein as car spatial data 314 corresponds to measured points on the surface of the car 310 with a line of sight to the LIDAR device 302. Similarly, a cluster of points referred to herein as tree spatial data 316 corresponds to measured points on the surface of the tree 312 visible from the LIDAR device 302. The absence of points between the car spatial data 314 and the tree spatial data 316 indicates an absence of reflective features along the sampled line of sight paths in the plane illustrated.

Each point in the example point cloud illustrated symbolically in FIG. 3C can be referenced by an azimuth angle #(e.g. orientation of the LIDAR device 302 while emitting the pulse corresponding to the point, which is determined by the orientation of the rotating angled mirror 304) and a line-of-sight (LOS) distance (e.g., the distance indicated by the time delay between pulse emission and reflected light reception). For emitted pulses that do not receive a reflected signal, the LOS distance can optionally be set to the maximum distance sensitivity of the LIDAR device 302. The maximum distance sensitivity can be determined according to the maximum time delay the associated optical sensors wait for a return reflected signal following each pulse emission, which can itself be set according to the anticipated signal strength of a reflected signal at a particular distance given ambient lighting conditions, intensity of the emitted pulse, predicted reflectivity of environmental features, etc. In some examples, the maximum distance can be approximately 60 meters, 80 meters, 100 meters, or 150 meters, but other examples are possible for particular configurations of the LIDAR device 302 and associated optical sensors.

In some embodiments, the sensor fusion algorithm 138, computer vision system 140, and/or computer system 112, can interpret the car spatial data 314 alone and/or in combination with additional sensor-indicated information and/or memory-based pattern-matching point clouds and/or baseline maps of the environment to categorize or identify the group of points 314 as corresponding to the car 310. Similarly, the tree spatial data 316 can identified as corresponding to the tree 310 in accordance with a suitable object-detection technique. As described further herein, some embodiments of the present disclosure provide for identifying a region of the point cloud for study with enhanced resolution scanning technique on the basis of the already-sampled spatial-points.

Figure 4B:
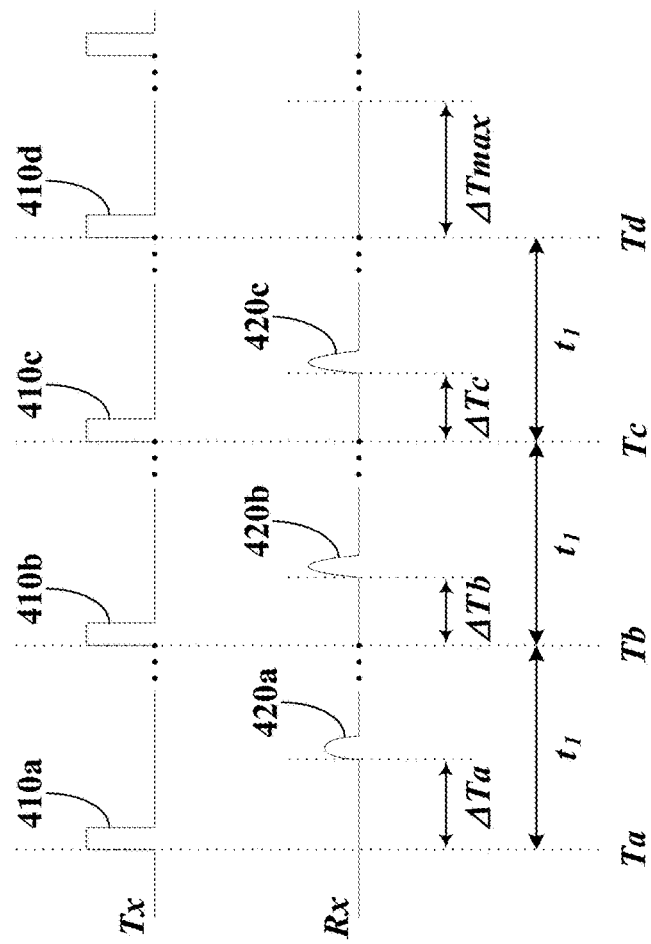
FIG. 4B is an example timing diagram of transmitted and received pulses for the symbolic illustration of FIG. 4A.
Figure 4A:
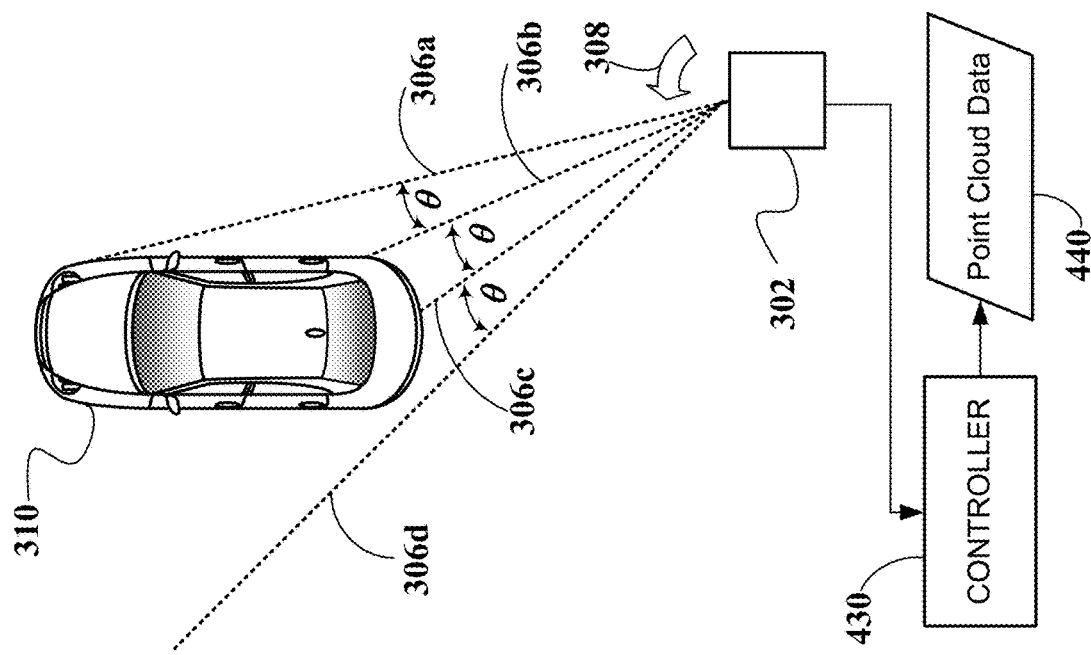
FIG. 4A symbolically illustrates a LIDAR device scanning across an example obstacle-filled environmental scene and using reflected signals to generate a point cloud.

FIG. 4A symbolically illustrates a LIDAR device 302 scanning across an example obstacle-filled environmental scene. The LIDAR device 302 scans the laser beam 306 across the environmental scene via its beam steering optics 304 while its laser light source pulses, such that successive pulses are emitted with an angular separation $\theta_1$. Successive pulses are emitted periodically with a temporal separation $t_1$. For illustrative purposes, the angular separation Oz between adjacent, successively emitted pulses is exaggerated in FIG. 4A to allow individual pulses to be represented in the drawing. As a result of the rotation of the beam steering optics in the LIDAR device 302, temporally separated pulses (e.g., pulses emitted at times separated by the time $t_1$) are directed in respective angular orientations separated by the amount of rotation of the beam steering optics during the interval $t_1$, (e.g., the angle $\theta_1$). A controller 430 is arranged to receive signals from the LIDAR device 302 and/or associated optical sensors to generate point cloud data 440 indicative of the 3-D positions of reflective features in the environmental scene surrounding the LIDAR device 302.

FIG. 4B is a timing diagram of the transmitted and received pulses for the exaggerated symbolic illustration of FIG. 4A. The timing diagram symbolically illustrates the transmitted pulses (labeled on FIG. 4B as "Tx") and the corresponding received pulses (labeled on FIG. 4B as "Rx").

An example operation of the LIDAR device 302 is described in connection with FIGS. 4A and 4B. At time Ta, a first pulse 410a is emitted from the LIDAR device 302 and directed along laser beam path 306a via the beam steering optics. As shown in FIG. 4A, the beam path 306a is reflected from near the front passenger-side region of the car 310, and a first reflected signal 420a is detected at optical signals associated with the LIDAR device 302 (e.g., via optical sensors included in the sensor system 202 mounted on the vehicle 200 in FIG. 2). The time delay between the emission of pulse 410a and reception of the reflected signal 420a is indicated by time delay ΔTa. The time delay ΔTa and the orientation of the LIDAR device 302 at time Ta, i.e., the direction of laser beam 306a, are combined in the controller 430 to map the 3-D position of the reflective point on the front passenger-side region of the car 310.

Next, at time Tb, a second pulse 410b is emitted from the LIDAR device 302 and directed along laser beam path 306b. Time Tb is temporally separated from time Ta by the interval time t1, and the direction of the laser beam path 306b is angularly separated from the direction of laser beam path 306a by angular separation $\theta_1$, due to the change in orientation of the beam steering optics in the LIDAR device during the interval $t_1$. The laser pulse 310b is reflected from near the rear passenger-side region of the car 310, and a second reflected signal 420b is detected with a relative time delay ΔTb from the emission of the second pulse 410b. As illustrated in FIG. 4B, the LIDAR device 302 is generally situated behind the car 310, and so the reflective point near the rear passenger-side region of the car 310 (responsible for the reflected signal 420b) is closer to the LIDAR device 302 than the reflective point near the front passenger-side region of the car 310 (responsible for the reflected signal 420a). As a result, the relative time delay ΔTb is shorter than the relative time delay ΔTa, corresponding to the difference in roundtrip travel time at the speed of light between the LIDAR device 302, and the respective reflective points at the front and rear of the car.

Further, the sensors detecting the reflected signals can optionally be sensitive to the intensity of the reflected signals. For example, the intensity of the reflected signal 420b can be perceptibly greater than the intensity of the reflected signal 420a, as shown symbolically in FIG. 4B. The controller 430 maps the 3-D position of the reflective point near the rear passenger-side of the car 310 according to the time delay value ΔTb and the orientation of the LIDAR device 310 at time Tb, i.e., the direction of laser beam 306b. The intensity of the reflected signal can also indicate the reflectance of the reflective point, in combination with the distance to the point as indicated by the measured time delay. The reflectance of the reflective point can be employed by software and/or hardware implemented modules in the controller 430 to characterize the reflective features in the environment. For example, traffic indicators such as lane markers, traffic signs, traffic signals, navigational signage, etc., can be indicated in part based on having a relatively high reflectance value, such as associated with a reflective coating applied to traffic and/or navigational signage. In some embodiments, identifying a relatively high reflectance feature can provide a prompt to undertake a further scan of the high reflectance feature with one or more sensors, such as those in the sensing system 104. Thus, in one example, a reflected signal indicating a high reflectance feature can provide a prompt to image the high reflectance feature with a camera to allow for identifying the high reflectance feature. In some embodiments where the high reflectance feature is a traffic sign, the camera image can allow for reading the sign via character recognition and/or pattern matching, etc. and then optionally adjusting navigational instructions based on the sign (e.g., a sign indicating a construction zone, pedestrian crosswalk, school zone, etc. can prompt the autonomous vehicle to reduce speed).

At time Tc, following the time Tb by the interval t1, a third pulse 410c is emitted from the LIDAR device 302. The third pulse 410c is directed along a laser beam path 306c, which is approximately angularly separated from the beam path 306b by the angle $\theta_1$. The pulse 410c is reflected from a point near the middle of the rear bumper region of the car 310, and a resulting reflected signal 420c is detected at the LIDAR device 302 (or its associated optical sensors). The controller 430 combines the relative time delay ΔTc between the emission of pulse 410c and reception of reflected signal 420c and the orientation of the LIDAR device 302 at time Tc, i.e., the direction of beam path 306c, to map the 3-D position of the reflective point.

At time Td, following time Tc by the interval $t_1$, a fourth pulse 410d is emitted from the LIDAR device 302. The fourth pulse 410d is directed along a laser beam path 306d, which is approximately angularly separated from the beam path 306c by the angle $\theta_1$. The beam path 306d entirely avoids the car 310, and all other reflective environmental features within a maximum distance sensitivity of the LIDAR device 302. As discussed above, the maximum distance sensitivity of the LIDAR device 302 is determined by the sensitivity of the associated optical sensors for detecting reflected signals. The maximum relative time delay ΔTmax corresponds to the maximum distance sensitivity of the LIDAR device (i.e., the time for light signals to make a round trip of the maximum distance). Thus, when the optical sensor associated with the LIDAR device 302 does not receive a reflected signal in the period ΔTmax following time Td, the controller 430 determines that no reflective features are present in the surrounding environment along the laser beam path 306d.

The reflective points on the car 310 corresponding to the reflected signals 420a-c form a subset of points included in a 3-D point cloud map 440 of the environment surrounding the LIDAR device 302. In addition, the direction of the laser beam 310d is noted in the 3-D point cloud map 440 as being absent of reflective features along the line of sight within the maximum distance sensitivity of the LIDAR device 302, because no reflected signal was received after the duration ΔTmax following the emission of pulse 410d at time Td. The points corresponding to laser beam directions 306a-d are combined with points spaced throughout the scanning zone (e.g., the region scanned by the LIDAR device 302), to create a complete 3-D point cloud map, and the results are output as fixed resolution point cloud data 440 for further analysis by object detection systems, pattern recognition systems, computer vision systems, etc.

IV. Example Laser Diode Firing Circuit

In order to illuminate a scanning zone with pulses of light, a LIDAR device includes one or more light sources that are triggered to emit pulses of light. The light sources may include light emitting elements such as a laser diode or another emissive light source. A laser diode is a semiconductor device including a p-n junction with an active region in which oppositely polarized, energized charge carriers (e.g., free electrons and/or holes) recombine while current flows through the device across the p-n junction. The recombination results in emission of light due to a change in energy state of the charge carriers. When the active region is heavily populated by such energized pairs (e.g., the active region may have a population inversion of energized states), stimulated emission across the active region may produce a substantially coherent wave front of light that is then emitted from the laser diode. Recombination events, and the resulting light emission, occur in response to current flowing through the device, and so applying a pulse of current to the laser diode results in emission of a pulse of light from the laser diode.

A light pulse with the desired temporal profile can be generated by applying a rapidly switched current to a laser diode (e.g., a current source that rapidly transitions from near zero current to a current sufficient to cause the laser diode to emit light). Circuits configured to convey such currents to laser diodes to cause the laser diodes to fire (e.g., emit a pulse of light) are referred to herein as laser diode firing circuits. One example laser diode firing circuit includes a laser diode connected in series with a transistor capable of switching large currents over brief transition times. Current through the laser diode, and thus emission from the laser diode, can then be controlled by operating the transistor. An example circuit may switch from near zero current through the laser diode, to about 30 amperes, and back to near zero all in a span of about 1-2 nanoseconds.

The firing circuits disclosed herein may include a laser diode configured to emit a pulse of light with a wavelength in the visible spectrum, ultraviolet spectrum, near infrared spectrum, and/or infrared spectrum. In one example, the laser diode is configured to emit a pulse of light in the infrared spectrum with a wavelength of about 905 nanometers.

Figure 5A:
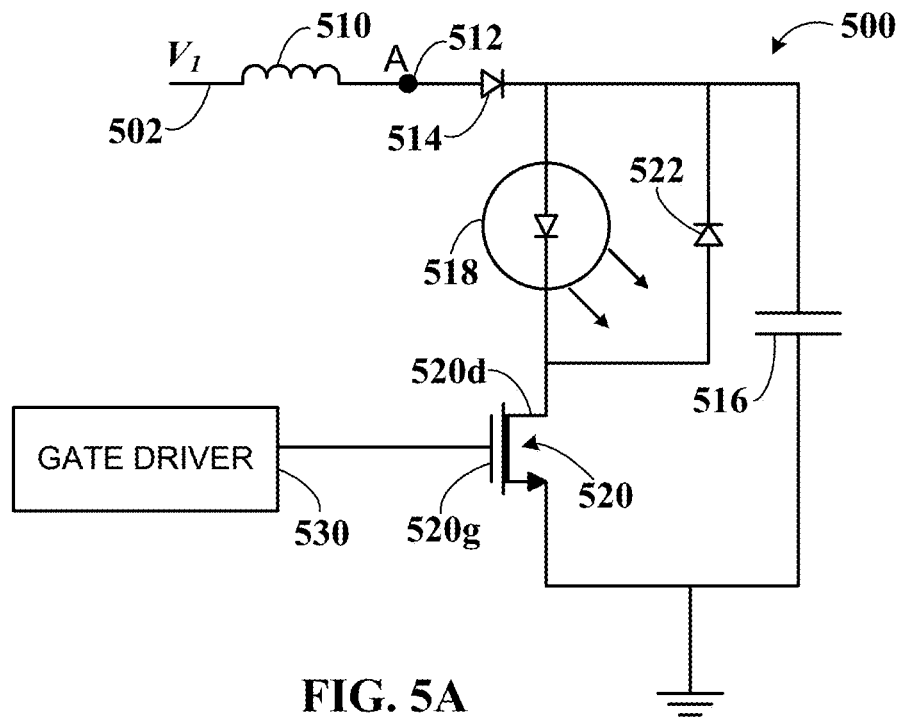
FIG. 5A is an example laser diode firing circuit.

FIG. 5A is an example laser diode firing circuit 500. The firing circuit 500 includes a capacitor 516 connected to a laser diode 518 and a transistor 520. In some examples, the capacitor 516, laser diode 518, and transistor 520 can be connected in series. The capacitor 516 is connected to both a charging path (e.g., FIG. 5C) and a discharge path (e.g., FIG. 5D). The capacitor 516 has one terminal coupled to a voltage source 502 (e.g., through inductor 510 and diode 514) and an anode of the laser diode 518. The other terminal of the capacitor 516 can be connected to ground, or to another reference voltage sufficient to allow the capacitor 516 to be charged by the voltage source 502, through the charging path. The cathode of the laser diode 518 is connected to one terminal of the transistor 520, which has another terminal connected to ground (which may also connect to the capacitor 516). The transistor 520 acts as a switch to selectively allow current to flow through the laser diode 518 according to a control signal from a gate driver 530.

A discharge diode 522 is coupled across the laser diode 518. The discharge diode 522 is configured to allow an internal capacitance of the laser diode 518 to discharge when the transistor 520 is turned off. For example, the discharge diode 522 may have an anode and a cathode; the anode can be connected to the cathode of the laser diode 518; the cathode can be connected to the anode of the laser diode 518. As such, charge remaining on an internal capacitance of the laser diode 518 following a firing operation causes the discharge diode 522 to be forward biased, and the internal capacitance is allowed to discharge through the discharge diode 522. Following such discharge, the discharge diode 522 is no longer forward biased.

To initiate firing, the gate driver 530 causes the transistor 520 to turn on by adjusting the voltage applied to the gate terminal 520g, which allows current to flow to the drain terminal 520d through the laser diode 518. The capacitor 516 discharges through a discharge path that includes the laser diode 518 and the transistor 520. The discharge current from the capacitor 516 causes the laser diode 518 to emit a pulse of light. The transistor 520 is turned back off by adjusting the voltage applied to the gate terminal 520g via the gate driver 530. Upon turning off the transistor 520, the laser diode 518 ceases emission.

The inductor 510 is connected between the voltage source 502 and the anode of the diode 514. For convenience in the description and the drawings a point connecting the inductor 510 and the anode of the diode 514 is labeled node A 512. The cathode of the diode 514 is connected to the capacitor 516 and also to the anode of the laser diode 518. The capacitor's 516 charging path, which couples the capacitor 516 and the voltage source 502, includes the inductor 510 and the diode 514. During charging, the voltage across the inductor 510 varies in accordance with changes in the inductor current, and the diode 514 regulates the voltage applied to the capacitor 516 depending on whether the diode 514 is forward biased or reverse biased. The diode 514 is forward biased (and thus allows the capacitor 516 to charge) when the voltage at node A 512 is greater than the voltage on the capacitor 516. The diode 514 is reverse based (and thus prevents the capacitor 516 from charging) when the voltage at node A 512 is less than the voltage on the capacitor 516. Voltage variations at node A 512 due to changes in current through the inductor 510 may result in a voltage being applied to the capacitor 516 that exceeds the voltage of the voltage source 502.

For example, the voltage source 502 connected to one side of the inductor 510 may have a voltage $V_1$. The voltage on the other side of the inductor 510, at node A 512, varies due to induced voltage across the inductor 510 as the inductor current changes. In particular, during a charging operation to recharge the capacitor 516, the current through the inductor 510 briefly increases and then decreases. As the inductor current increases, the voltage at node A 512 may decrease to a voltage less than $V_1$. As the inductor current changes from increasing to decreasing, the voltage at node A 512 may increase to a higher level voltage (e.g., a voltage greater than $V_1$), before decreasing. The transient higher level voltage at node A 512 (e.g., $>V_1$) is applied to the capacitor 516, which charges as the voltage at node A 512 decreases due to the inductor current continuing to decrease. The capacitor 516 charges until the voltage on the capacitor 516 approximately equal the voltage at node A 512. Upon the voltage at node A 512 approximately equaling the voltage on the capacitor 516, the diode 512 is reverse biased. Upon the diode 514 being reverse biased, the current through the inductor 510 goes to zero and the voltage across the inductor 510 settles at zero, which sets node A to the voltage of the voltage source 502 (e.g., the voltage $V_1$), but the capacitor 516 may hold a higher voltage (e.g., about 2 $V_1$).

The transistor 520 may be a field effect transistor (FET) with a channel region including Gallium nitride (i.e., the transistor 520 may be a GaNFET). However, alternative FETs may be employed, such as FETs configured to rapidly switch large current values, such as transistors with carrier mobility (e.g., high electron mobility transistors (HEMTs)). In FIG. 5A, the transistor 520 is illustrated as a field effect transistor (FET); although it is understood the firing circuit 500 may be implemented with alternative transistors to selectively switch current through the laser diode, such as a bipolar junction transistor, etc. Further, while the transistor 520 is illustrated as an n-type transistor, a complementary circuit may be formed using a p-type transistor.

Figure 5B:
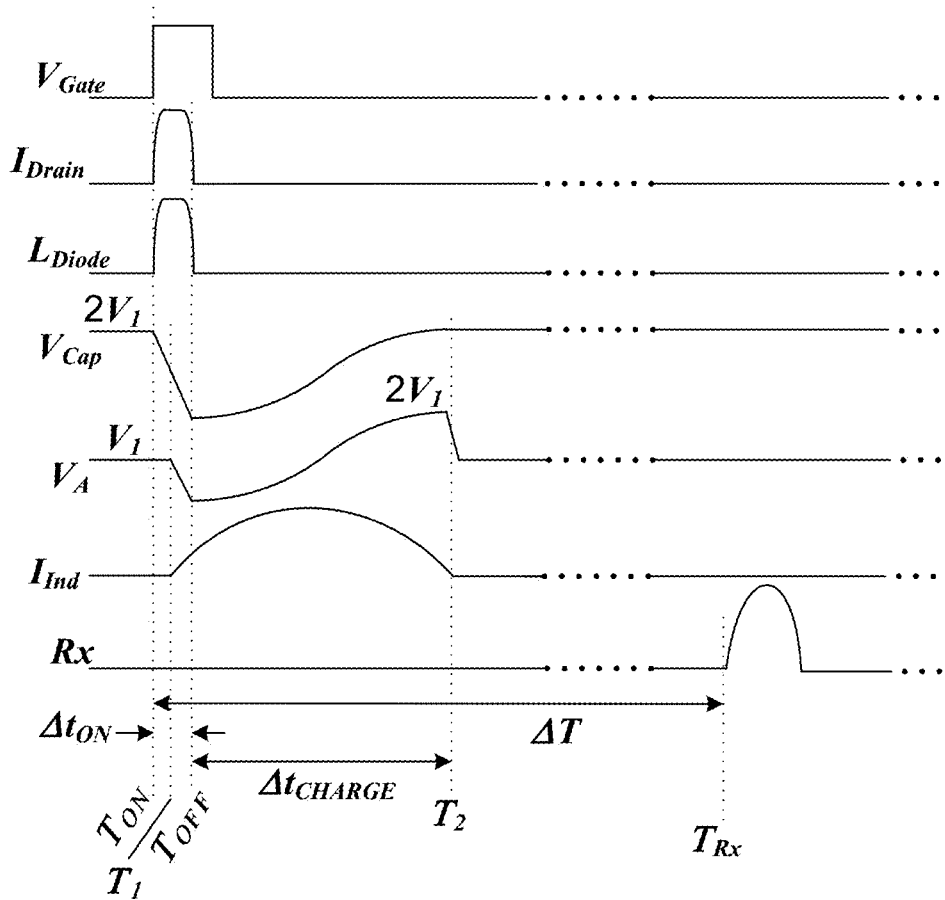
FIG. 5B is a timing diagram that shows operation of the example laser diode firing circuit of FIG. 5A.

FIG. 5B is a timing diagram of a pulse emission operation of the example laser diode firing circuit 500 of FIG. 5A. Shown in FIG. 5B is the gate voltage $V_{Gate}$ of the FET 520, the drain current $I_{Drain}$ of the FET 520, the luminosity $L_{Diode}$ of the laser diode 518, the voltage $V_{Cap}$ of the capacitor 516, the voltage $V_A$ at node A 512, the current $I_{Ind}$ through the inductor 510, and the light signal received Rx from a reflected portion of the emitted pulse. For convenience in the description, the time at which an initiating signal is applied to the transistor 520 and a pulse is emitted is referred to herein and in the drawings as the turn on time $T_{ON}$.

Initially, the capacitor 516 is charged to a voltage set in part by the voltage source 502. The charge on the capacitor 516 may exceed the voltage $V_1$ of the voltage source 502 due to transient variations at node A 512 caused by changes in current through the inductor 510. A voltage that exceeds $V_1$ may be held on the capacitor 516 after the diode 514 is reverse biased to terminate a charging operation. For example, the capacitor 516 may be initially charged to a voltage level of about 2 $V_1$. At the turn on time $T_{ON}$, an initiating signal is applied to the transistor 520 from the gate driver 530. The initiating signal can be a gate voltage $V_{Gate}$ that transitions from a low level to a high level so as turn on the transistor 520. The transistor 520 turns on and the drain current $I_{Drain}$ transitions from a current near zero to a current sufficient to drive the laser diode 518. The laser diode 518 emits a pulse of light, as indicated by the luminosity $L_{Diode}$. As the drain current $I_{Drain}$ flows through the laser diode 518, the capacitor 516 discharges to source current to the laser diode 518. In some examples, during pulse emission, the capacitor 516 and the parasitic capacitance of the laser diode 518 can combine to form a resonant LC tank circuit, which is heavily damped. Discharging the capacitor 516 thus transfers the electrical energy charged on the capacitor 516 to the laser diode 518, where energy is consumed by current flowing in the laser diode to produce light. Upon completion of a single half-cycle of the damped LC oscillation, there may be almost no energy left to continue to drive current through the laser diode 518, and remaining voltage, if any, can return to the capacitor 516 via the diode 522 connected in parallel across the laser diode 518.

In practice then, the energy stored on the capacitor 516 may be consumed, and the laser diode 518 may turn off (at time $T_{OFF}$), following a single half-cycle of the resonant LC circuit formed by the capacitor 516 and the parasitic inductance of the inductor 518. The pulse duration $\Delta t_{ON}$ may be about 20 nanoseconds in some examples. In some cases (and as shown in FIG. 5B), the laser diode 518 may cease emitting light prior to turning off the transistor 520 (e.g., by adjusting the gate voltage $V_{Gate}$). Although, in some examples, and depending on the values of the capacitor 516 and the parasitic inductance of the laser diode 518, the pulse duration $\Delta t_{ON}$ may continue until the transistor 520 turns off. Thus, in some examples, the transistor 520 can be turned off by adjusting the gate voltage $V_{Gate}$ to a level sufficient to turn off the transistor 520, which terminates current flowing through the laser diode 518.

The charging cycle is initiated in response to the transistor 520 firing, which discharges the capacitor 516. Upon the capacitor voltage $V_{Cap}$ discharging to a voltage level sufficient to forward bias the diode 514, at time $T_1$, current begins flowing through the inductor 510 (as indicated by $I_{Ind}$ in FIG. 5B). In FIG. 5B, time $T_1$ is shown during the interval $\Delta t_{ON}$ (i.e., before $T_{OFF}$), although in some implementations the diode 514 may not begin conducting current until the transistor 520 has turned off (i.e., after $T_{OFF}$). The increase in inductor current $I_{Ind}$ causes the voltage at node A 512 to decrease in proportion to the time derivative of the inductor current $I_{Ind}$, because changes in the inductor current $I_{Ind}$ induce a voltage in the inductor 510 that opposes the direction of any current change. The voltage at node A 512, and thus the increasing inductor current $I_{Ind}$, are prevented from changing so rapidly as to reverse bias the diode 514.

For example, starting at time $T_1$, the voltage at node A 512 may decrease to a voltage level less than $V_1$ (as indicated by $V_A$ in FIG. 5B). At time $T_{OFF}$, current ceases flowing through the laser diode 518, and the diode 514 connects the inductor 510 and the capacitor 516, which form a resonant LC tank circuit. The current from the inductor 510 charges the capacitor 516, in a sinusoidal oscillatory fashion. At one quarter of the oscillation period, the inductor current $I_{Ind}$ reaches a maximum, and begins to decrease. At that point, the resonant LC circuit divides its stored energy with about half in the capacitor 516 and about half in the inductor 510. Continuing with the sinusoidal oscillation, current continues to flow to the capacitor 516, until the mid-point of the oscillation cycle, at time $T_2$, at which point the current reaches zero and the capacitor 516 stores substantially all of the energy that had been divided between the inductor 510 and the capacitor 516. Before the energy stored on the capacitor 516 can transfer back to the inductor 510, the diode 514 becomes reverse biased, which causes the capacitor 516 to remain charged with approximately twice the supply voltage $V_1$. For example, the supply voltage $V_1$ may be about 20 volts and the voltage stored on the capacitor 516 following charging may be about 40 volts.

The oscillatory LC circuit described herein efficiently transfers energy between the inductor 510 and the capacitor 516 during the recharge interval $\Delta t_{CHARGE}$ of the circuit 500, but the present disclosure is not limited to the use of resonant LC circuits. Generally, the capacitor 516 may be charged to a greater value than the supply voltage $V_1$ based on transient voltages on the inductor 510 caused by changes in current following firing of the circuit 500. Current through the inductor 510 may change from increasing (e.g., between times $T_1$ and $T_{OFF}$) to decreasing (e.g., following time $T_{OFF}$), and the sudden change in current through the inductor 510 can induce a rapid increase in voltage at node A 512. For example, at time $T_{OFF}$, the voltage at node A 512 can go to a voltage greater than $V_1$, and may be several times $V_1$. The precise voltage applied to node A 512 depends on the time derivative of the inductor current when transitioning from an increasing current to a decreasing current, but may be several times the voltage of the voltage source 502 (e.g., just after $T_{OFF}$, $V_A \approx X\ V_1$, with X>2).

Following the increase in the voltage at node A 512, the current through the inductor 510 can continue to decrease as the capacitor 516 becomes charged, and the voltage at node A 512 can therefore decrease. The capacitor 516 may continue charging until the diode 514 becomes reverse biased, at time $T_2$ in FIG. 5B. While charging, between times $T_{OFF}$ and $T_2$, the voltage $V_{Cap}$ across the capacitor 516 increases and the voltage $V_A$ of node A 512 decreases. The time $T_2$, at which the charging cycle stops, occurs when the two voltages approximately equal one another (e.g., $V_A \approx V_{Cap}$). In some examples, the voltage at which the two voltages are approximately equal so as to terminate the charging cycle occurs for a voltage of about 2 $V_1$ (e.g., 2 $V_1 \approx V_A \approx V_{Cap}$). The voltage on the capacitor 516 (i.e., $V_{Cap}$) following the charging cycle may be, for example, about 40 Volts. Upon the diode 514 becoming reverse biased, at time $T_2$, the charging current stops flowing through the diode 514, and therefore the current $I_{Ind}$ through the inductor 518 changes quickly to zero. The change in inductor current at time $T_2$ is therefore accompanied a change in the voltage $V_A$ of node A, to return to the voltage of the voltage source 502 (i.e., the voltage $V_1$).

The voltage variations across the inductor 510 can be described in terms of energy temporarily stored in a magnetic field of the inductor 510 and then released. Energy stored in an inductor's magnetic field is proportionate to the square of the current flowing through the inductor. When the inductor current $I_{Ind}$ is increased, the inductor 510 increases the energy stored in its magnetic field (e.g., according to the difference in current $I_{Ind}$). Increasing the inductor current $I_{Ind}$ thus charges the energy stored in the magnetic field of the inductor 510 from a low energy level (e.g., zero) to a high energy level. When the inductor 510 is being charged by an increasing current from the voltage source 502, the induced voltage across the inductor 510 opposes the change in current and so node A 512 goes to a voltage less than $V_1$. By contrast, when the inductor current $I_{Ind}$ is decreased, the energy stored in the magnetic field of the inductor 510 is decreased. Decreasing the inductor current $I_{Ind}$ thus discharges the energy stored in the magnetic field of the inductor 510 from high energy level to a low energy level. When the inductor 510 is being discharged by a decreasing current from the voltage source 502, the induced voltage across the inductor 510 opposes the change in current and so node A 512 goes to a voltage higher than $V_1$. However, the diode 514 only remains forward biased while the voltage at node A 512 exceeds the voltage across the capacitor 516.

The diode 514 and inductor 510 can thus combine to cause the capacitor 516 to be charged to a voltage that exceeds the voltage $V_1$ of the voltage source 502. For example, the diode 514 is forward biased when the voltage across the capacitor 516 is at a lower level, such as between time times $T_{OFF}$ and $T_2$ as shown in FIG. 5B when the capacitor voltage $V_{Cap}$ charges from less than $V_1$ to about 2 $V_1$. However, the diode 514 is reverse biased when the voltage across the capacitor 516 is at a higher level, such as following time $T_2$ as shown in FIG. 5B when the capacitor voltage $V_{Cap}$ remains at about 2 $V_1$ while the voltage $V_A$ at node A 512 decreases to $V_1$. For example, $V_1$ may be about 20 Volts and the capacitor voltage $V_{Cap}$ following charging may be about 40 Volts.

In some examples, the firing circuit 500 is operated such that the capacitor 516 is recharged immediately following emission of a pulse of light from the laser diode 518. As shown in FIG. 5B, a capacitor recharging interval $\Delta t_{CHARGE}$ begins at the transistor turn off time $T_{OFF}$ and ends with the reverse biasing of the diode 514, at time $T_2$. The capacitor recharging interval $\Delta t_{CHARGE}$ may be approximately 500 nanoseconds, for example. Moreover, by configuring the firing circuit 500 such that the capacitor 516 is recharged immediately following a pulse emission, the firing circuit 500 can be recharged and ready to emit a subsequent pulse faster than an alternative configuration. If, for example, a recharging operation were to be initiated after some duration following a pulse emission (e.g., using a second transistor other than a transistor controlling current through a laser diode), the additional time would increase the lag time between emission of subsequent pulses and thus reduce the duty cycle of the firing circuit. In some examples, the firing circuit 500 is configured to immediately recharge the capacitor 516 upon emission of a pulse because the recharging operation is initiated in response to operation of the same transistor 520 that initiates emission (e.g., turning on the transistor 520 both causes a pulse to be emitted and, upon sufficient discharge from the capacitor 516, causes the diode 514 to become forward biased and current to begin flowing through the inductor 510 so as to initiate charging).

The light pulse emitted at time $T_{ON}$ can be reflected from an environmental object, such as an obstacle surrounding an autonomous vehicle, and a light signal from the reflected portion of the emitted pulse is received via a photo detector at reception time $T_{Rx}$. The time $\Delta T$ between the emission time (at time $T_{ON}$) and the reception time $T_{Rx}$ can then be used to calculate the distance to the reflective object. For example, the round trip travel time $\Delta T$ can be multiplied by the speed of light in the surrounding atmosphere to get the round trip distance, which is twice the distance to the reflective object.

In some examples, the emission time of the emitted pulse may be determined using a feedback loop configured to react to the discharge current flowing through the laser diode 518.

For example, a conductive loop may be situated such that a voltage is induced in the loop due to changing magnetic flux through the loop in response to the discharge current flowing through the firing circuit 500. The voltage across the leads of such a conductive feedback loop can then be detected, and the time at which a pulse is emitted from the firing circuit can be estimated based on the time the voltage is detected. Such a system can be used to reduce timing uncertainty in the firing time due to delays between application of the turn on signal (e.g., the gate voltage $V_{Gate}$) and the firing of the laser diode 518, which may involve some non-zero random and/or systematic timing delay and/or timing jitter.

Figure 5D:
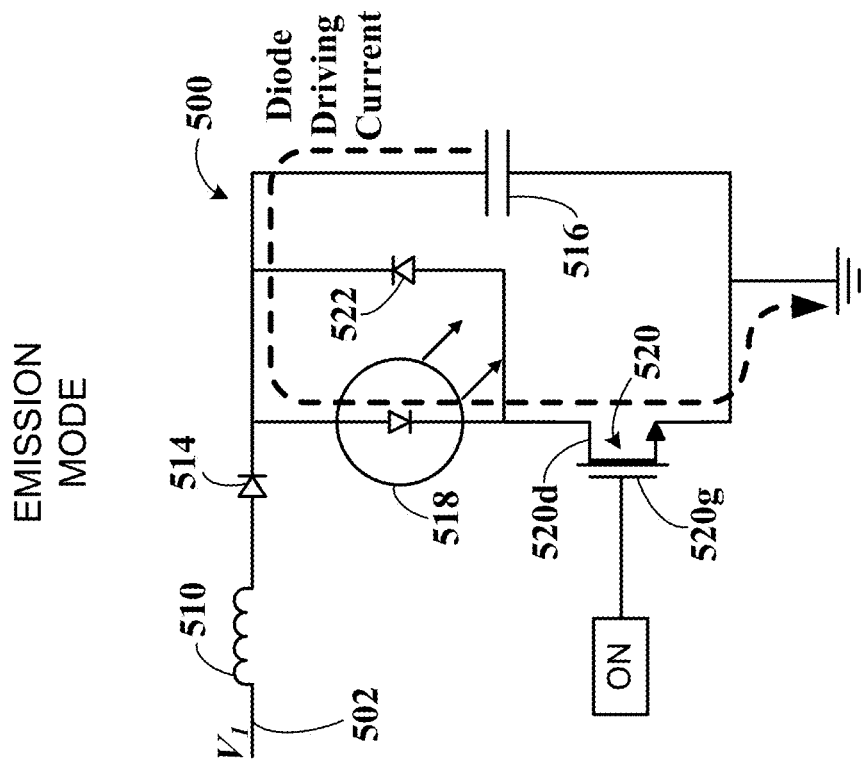
FIG. 5D shows a current path through the example laser diode firing circuit of FIG. 5A during an emission mode.
Figure 5C:
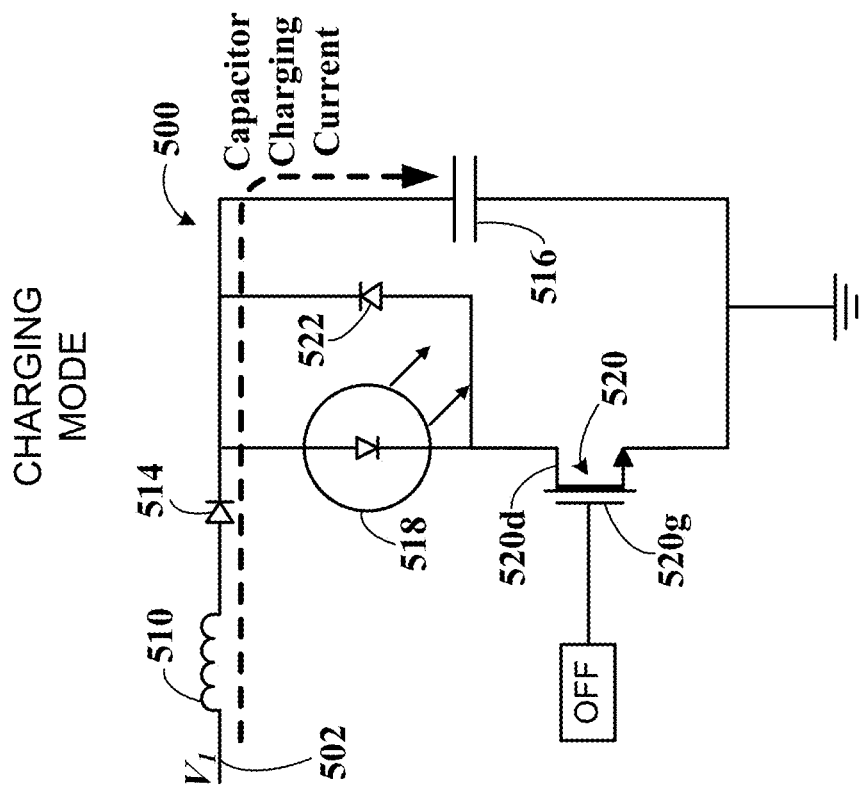
FIG. 5C shows a current path through the example laser diode firing circuit of FIG. 5A during a charging mode.

FIG. 5C shows a current path through the example laser diode firing circuit 500 of FIG. 5A during a charging mode. During charging, the voltage across the capacitor 516 is less than the voltage at the node between the inductor 510 and diode 514 such that the diode 514 is forward biased. In addition, the transistor 520 is turned off (as indicated by the OFF block coupled to the gate terminal 520g in FIG. 5C). As such, current does not flow through the laser diode 518, and instead flows to accumulate charge across the capacitor 516. The dashed arrow in FIG. 5C illustrates such a charging current path, which flows from the voltage source 502 (which may have a voltage $V_1$), through the biasing diode 514, toward the capacitor 516. In some examples, following a discharge, the capacitor 516 can be recharged in preparation for a subsequent discharge (and associated pulse emission) event in about 500 nanoseconds.

FIG. 5D shows a current path through the example laser diode firing circuit 500 of FIG. 5A during an emission mode. During emission, the transistor 520 is turned on (as indicated by the ON block coupled to the gate terminal 520g in FIG. 5D). As such, the capacitor 516 is connected across the laser diode 518 (via the turned on transistor 520), and so the charge on the capacitor 516 rapidly discharges through the laser diode 518 and the transistor 520. The dashed arrow in FIG. 5D illustrates such a discharge current path, which flows from the capacitor 516, through the laser diode 518 and the transistor 520 toward ground. Upon the transistor 520 being turned on, the discharge current flows rapidly to discharge the capacitor 516 and the resulting change in current (e.g., increase in current) causes the laser diode 518 to emit a pulse of light.

The current paths shown in FIGS. 5C and 5D illustrate two operation modes of the firing circuit 500: a charging mode (FIG. 5C) and an emission mode (FIG. 5D). In some examples, the firing circuit 500 switches between the charging mode and the emission mode based solely on whether the transistor 520 is turned on or turned off. In the charging mode, the transistor 520 is turned off and current flows from the voltage source 502 to the capacitor 516 via the charging path (e.g., the current path including the inductor 510 and diode 514) until the diode 514 is reverse biased. In the emission mode, the transistor 520 is turned on and current flows from the charged capacitor 516 through the laser diode 518 and the transistor 520 until the transistor 520 is turned off again.

Figure 5E:
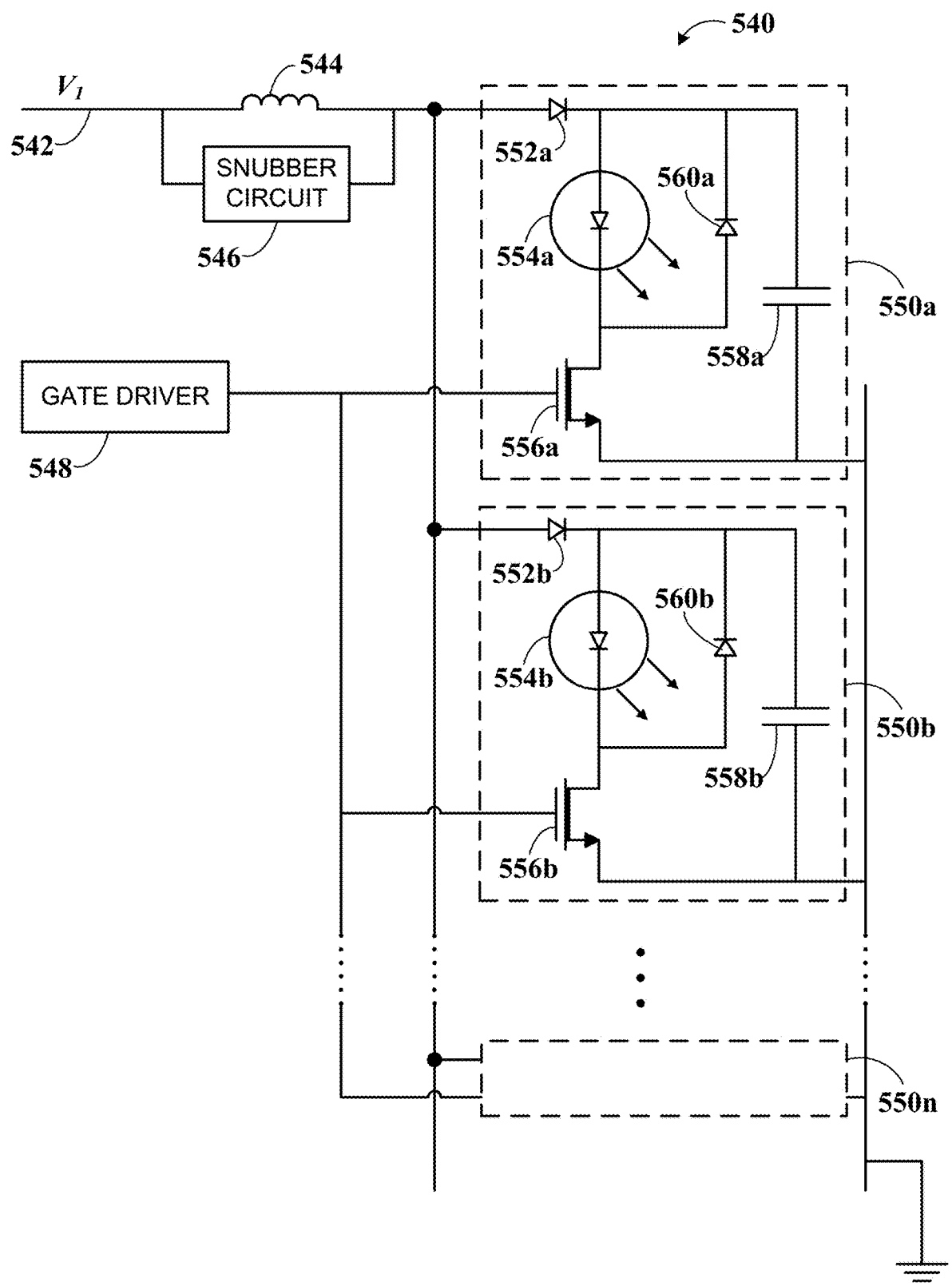
FIG. 5E illustrates an arrangement in which multiple laser diode firing circuit are charged via a single inductor.

FIG. 5E illustrates an arrangement 540 in which multiple laser diode firing circuits 550a-n are connected to be charged via a single inductor 544. The inductor 544 has one terminal connected to a voltage source 542 (labeled $V_1$), and a second terminal that connects to the firing circuits 550a-n so as to be included in a charging path of the respective firing circuits 550a-n. Each of the firing circuits 550a-n can be similar to the firing circuit 500 described above in connection with FIGS. 5A-5D. For example, the first firing circuit 550a includes a capacitor 558a connected to a laser diode 554a and a transistor 556a. The capacitor 558a, laser diode 554a, and transistor 556a can be connected in series such that turning on the transistor 556a causes the capacitor 558a to discharge through the laser diode 554a, which causes the laser diode to emit a pulse of light. A discharge diode 560a can be connected across the laser diode 554a to discharge the internal capacitance of the laser diode 554a. The first firing circuit 550a also includes a diode 552a that connects the firing circuit 550a to the inductor 544 and the voltage source 542. The diode 552a can function similarly to the diode 514 described above in connection with FIGS. 5A-5D. For example, the diode 552a can become forward biased and draw current through the inductor 544 to charge the capacitor 558a following a firing event (and associated discharge of the capacitor 558a). Upon the capacitor 558a being recharged, the diode 552a can then become reverse biased and thereby cause the capacitor 558a to maintain its stored charge.

The second firing circuit 550b is similarly connected to the inductor 544 via a diode 552b and includes a capacitor 558b, laser diode 554b, transistor 556b, discharge diode 560b. One or more additional firing circuits can also be similarly connected in parallel with the inductor 544 to the "nth" firing circuit 550n. In some cases, the arrangement 540 includes 16 individual laser diode firing circuits 550a-n connected to the single inductor 544.

Similar to the operation of the firing circuit described above in connection with FIGS. 5A-5D, the firing circuits 550a-n are turned on and off by operation of their respective transistors 556a-n, which are controlled by the respective gate voltages applied by the gate driver 548. For example, the gate driver 548 can be used to turn on all of the firing circuits 550a-n at substantially the same time by setting the gate voltage high (or otherwise manipulating the gate voltage to turn the respective transistors on). The discharging capacitors 558a-n cause current to begin flowing through the inductor 544. Upon the transistors 556a-n in the firing circuits 550a-n being turned back off (by the gate driver 548), the voltage across the inductor rises to begin recharging the capacitors 558a-n in the firing circuits 550a-n until the respective diodes 552a-n are reverse biased, at which point recharging terminates.

Additionally, the firing circuit arrangement 540 shown in FIG. 5E also illustrates a snubber circuit 546 connected across the inductor 544. The snubber circuit 546 provides an alternative current path during rapid current switching through the inductor 544 to regulate and/or smooth the resulting variations across the inductor 544. The snubber circuit 546 may include a resistor and/or capacitor connected in parallel across the inductor 544, for example. The snubber circuit 546 may additionally or alternatively include one or more diodes and/or solid state components configured to limit and/or regulate the maximum voltage and/or maximum voltage rate across the inductor 544. Thus, the snubber circuit 546 may operate actively and/or passively to modify transient voltage variations across the inductor 544. In some cases, the snubber circuit 544 may be used to prevent transient voltage variations from exceeding a predetermined threshold and thereby prevent damage to circuit components. While illustrated in FIG. 5E, the snubber circuit 544 may (or may not) be included in particular implementations of the arrangement 540 shown in FIG. 5E. Moreover, a snubber circuit may (or may not) be included across the charging path inductor in a particular implementation of the single firing circuit arrangement described above in connection with FIG. 5A-5D.

V. Example Operations

Figure 6A:
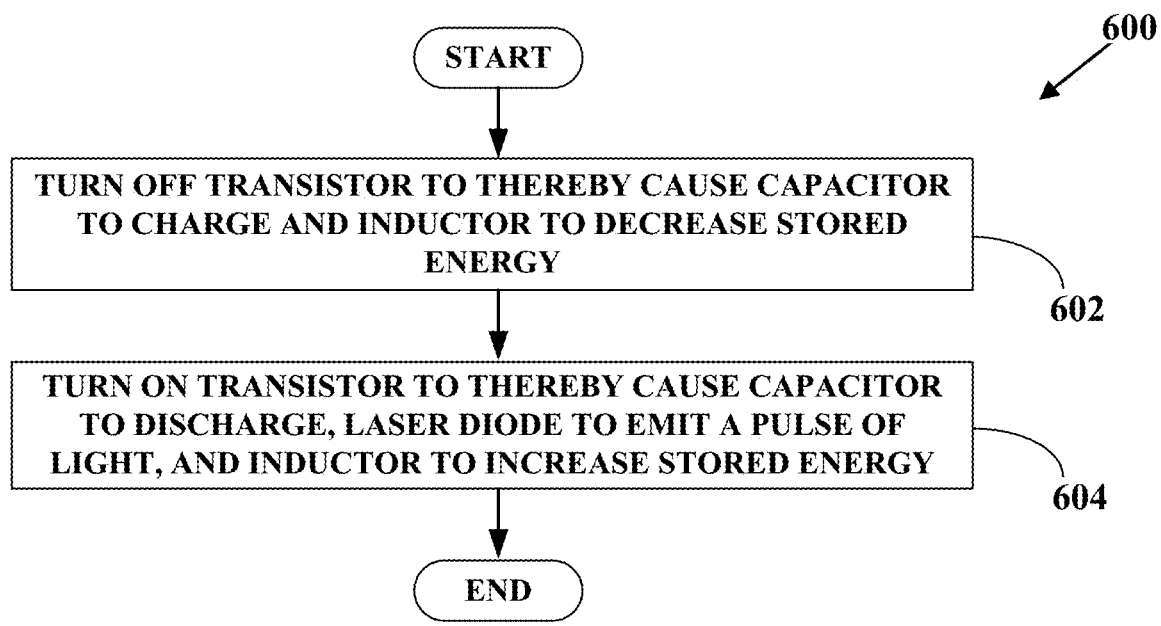
FIG. 6A is a flowchart of an example process for operating a laser diode firing circuit.
Figure 6B:
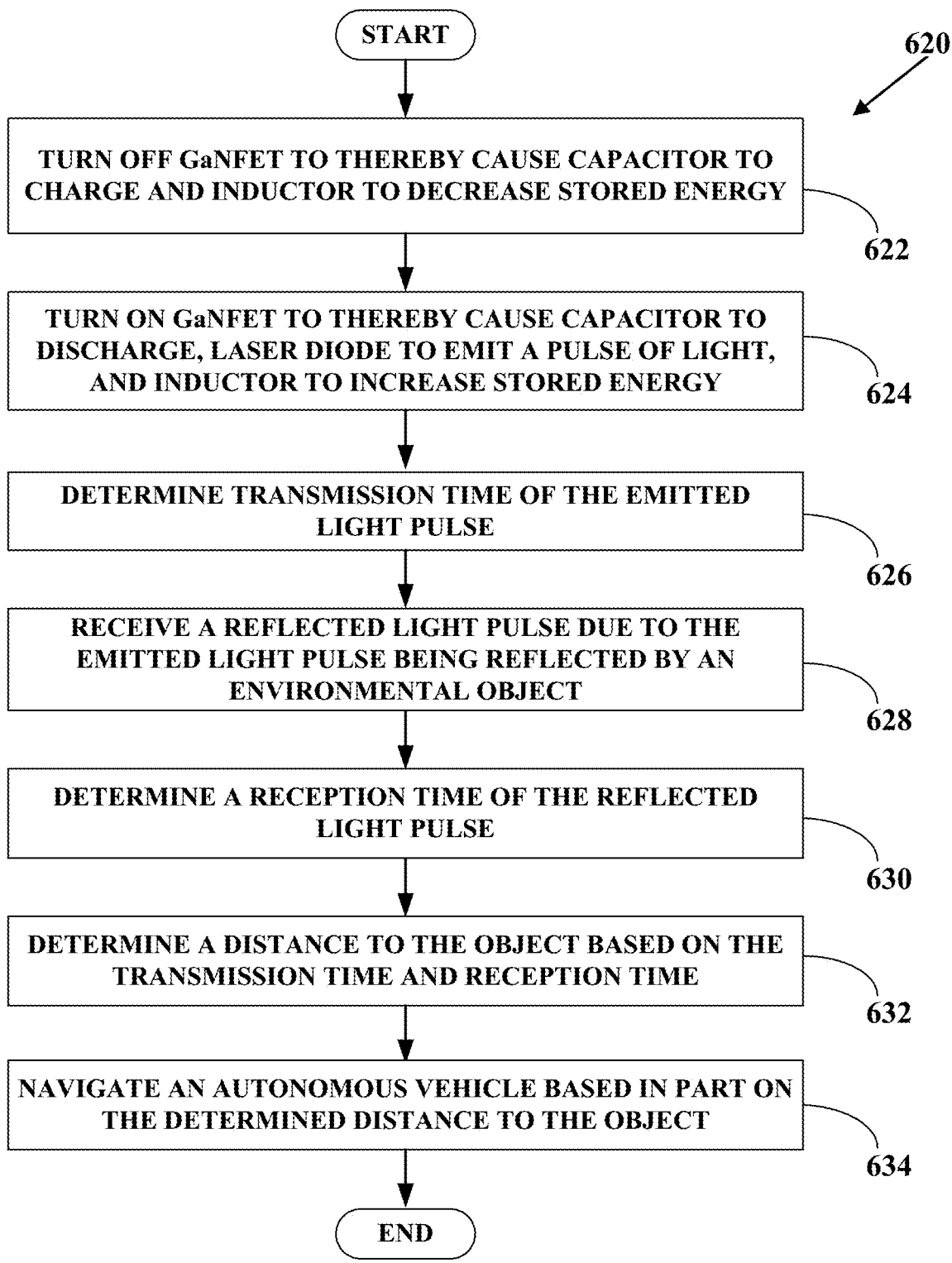
FIG. 6B is a flowchart of an example process for operating a LIDAR device.
Figure 6C:
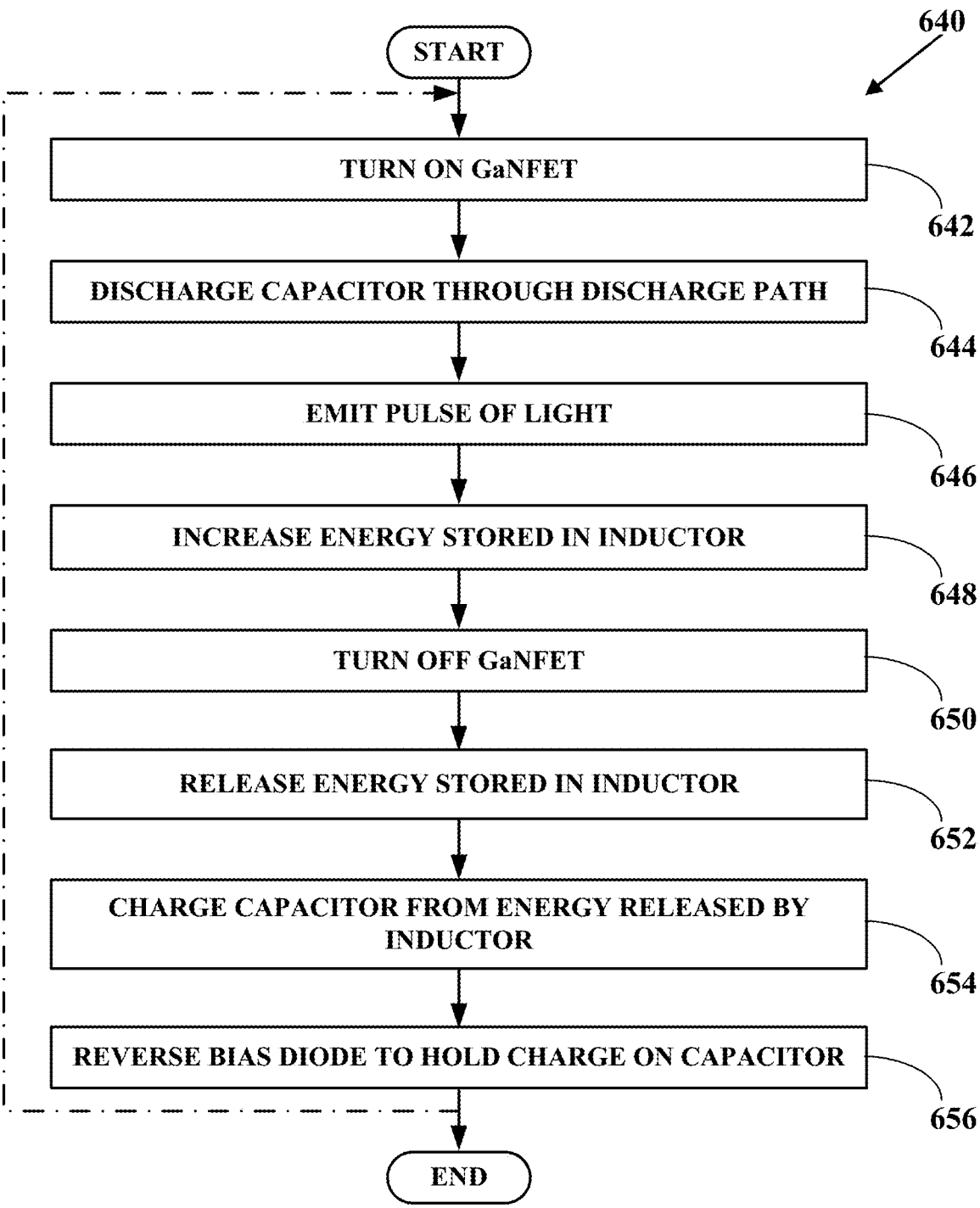
FIG. 6C is a flowchart of another example process for operating a laser diode firing circuit.

FIGS. 6A through 6C present flowcharts describing processes employed separately or in combination in some embodiments of the present disclosure. The methods and processes described herein are generally described by way of example as being carried out by an autonomous vehicle, such as the autonomous vehicles 100, 200 described above in connection with FIGS. 1 and 2. For example, the processes described herein can be carried out by the LIDAR sensor 128 mounted to an autonomous vehicle in communication with the computer system 112, sensor fusion algorithm module 138, and/or computer vision system 140.

Furthermore, it is noted that the functionality described in connection with the flowcharts described herein can be implemented as special-function and/or configured general-function hardware modules, portions of program code executed by a processor (e.g., the processor 113 in the computer system 112) for achieving specific logical functions, determinations, and/or steps described in connection with the flowcharts. Where used, program code can be stored on any type of computer readable medium (e.g., computer readable storage medium or non-transitory media, such as data storage 114 described above with respect to computer system 112), for example, such as a storage device including a disk or hard drive. In addition, each block of the flowcharts can represent circuitry that is wired to perform the specific logical functions in the process. Unless specifically indicated, functions in the flowcharts can be executed out of order from that shown or discussed, including substantially concurrent execution of separately described functions, or even in reverse order in some examples, depending on the functionality involved, so long as the overall functionality of the described method is maintained. Furthermore, similar combinations of hardware and/or software elements can be employed to implement the methods described in connection with other flowcharts provided in the present disclosure.

FIG. 6A is a flowchart of an example process 600 for operating a laser diode firing circuit. The laser diode firing circuit may be the laser diode firing circuit 500 described above in connection with FIG. 5. The laser diode firing circuit may therefore include a capacitor connected to a charging path and a discharge path. The discharge path can include a laser diode and a transistor, and the charging path can include an inductor and a diode. At block 602, the transistor is turned off, which causes the capacitor to charge via the charging path. The current through the charging path can flow through the inductor and the diode. As charge builds on the capacitor, the current through charging path (and the inductor) decreases. The decrease in current through the inductor causes the inductor to discharge energy stored in its magnetic field. For example, the energy stored in the magnetic field of the inductor may transition from a higher energy level to a lower energy level in response to the transistor being turned off. At block 604, the transistor can be turned on, which causes the capacitor to discharge via the discharge path. The current through the discharge path can flow through the laser diode and the transistor, which causes the laser diode to emit a pulse of light. The voltage stored on the capacitor can discharge until the diode is forward biased, which causes the current through the charging path (and the inductor) to increase. The increase in current through the inductor causes the inductor to charge energy stored in its magnetic field. For example, the energy stored in the magnetic field of the inductor may transition from a lower energy level to a higher energy level in response to the transistor being turned on.

In some embodiments, the operation of the transistor in blocks 602 and 604 provides for operation of a laser diode firing circuit to emit pulses of light and recharge by manipulating only a single transistor. In particular, turning the transistor on (block 604) can cause the circuit to both emit a pulse of light (by discharging the capacitor through the laser diode) and initiate a recharge cycle (by the voltage on the capacitor discharging to a level sufficient to forward bias the diode in the charging path). The recharge cycle is then terminated in response to turning off the transistor (block 602), which directs the current conveyed via the charging path to the capacitor (rather than through the laser diode).

FIG. 6B is a flowchart of an example process 620 for operating a light detection and ranging (LIDAR) device. The LIDAR device includes a light source having a laser diode firing circuit similar to the firing circuit 500 described above in connection with FIG. 5. For example, the laser diode firing circuit may include a laser diode activated by current through a discharge path of a capacitor. A transistor in the discharge path is configured to control such discharge events by turning on and turning off. The capacitor is also connected to a charging path that includes an inductor and a diode. The transistor may be, for example, a Gallium nitride field effect transistor (GaNFET). At block 622, the GaNFET is turned off to thereby cause the capacitor to charge (via the charging path) and the inductor (in the charging path) to decrease its stored energy. The inductor can release stored energy as current through the inductor decreases. At block 624, the GaNFET is turned on to thereby cause the capacitor to discharge (via the discharge path), which causes the laser diode to emit a pulse of light. The inductor charges to an increased stored energy level due to increasing current through the inductor, which occurs once the diode is forward biased. At block 626, the transmission time of the emitted pulse (e.g., the pulse emission time) is determined. The pulse emission time may be determined based on the time at which the transistor is turned on to initiate the discharge current and/or based on the time an induced voltage is detected in a conductive feedback loop configured to react to changes in the discharge current path. At block 628, a reflected light pulse is received. The reflected light pulse can include at least a portion of the light pulse emitted in block 624 that is reflected from a reflective object in an environment surrounding the LIDAR device. At block 630, a reception time of the reflected light pulse is determined. At block 632, a distance to the reflective object is determined based on both the time of reception determined in block 630 of the reflected light signal and the transmission time determined in block 624. For example, the distance can be determined based on computing the round trip travel time to the reflective object from the difference of the reception time and emission time, multiplying by the speed of light in the surrounding environment and dividing by 2. At block 634, the autonomous vehicle is navigated based at least in part on the determined distance to the reflective object. In some examples, one or more of the control systems 106 of the autonomous vehicle 100 described in connection with FIG. 1 may control the autonomous vehicle to avoid obstacles (e.g., the reflective object), navigate toward a predetermined destination, etc.

FIG. 6C is a flowchart of another example process 640 for operating a laser diode firing circuit. The laser diode firing circuit may be similar to the firing circuit 500 described above in connection with FIG. 5. For example, the laser diode firing circuit may include a laser diode activated by current through a discharge path of a capacitor. A transistor in the discharge path is configured to control such discharge events by turning on and turning off. The capacitor is also connected to a charging path that includes an inductor and a diode. The transistor may be, for example, a Gallium nitride field effect transistor (GaNFET). At block 642, the GaNFET is turned on. At block 644, the capacitor discharges through the discharge path. At block 646, a pulse of light is emitted from the laser diode due to the discharge current. At block 648, energy stored in the inductor included in the charging path is increased. For example, upon the diode in the charging path becoming forward biased, the current through the inductor can be increased, which causes energy to be stored in the magnetic field of the inductor. At block 650, the GaNFET is turned off. At block 652, energy stored in the inductor is released as the inductor current decreases. At block 654, the capacitor is charged from energy released by the inductor. For example, following turning off the GaNFET, current through the inductor is conveyed to the capacitor via the charging path. The inductor current can transition from increasing (while the transistor is on) to decreasing (once the transistor is off and current no longer flows through the laser diode). The decrease in inductor current causes the inductor to release its stored energy, and that released energy can be transferred, at least in part, to the capacitor. At block 656, the charging path diode can become reverse biased, which causes the capacitor to hold charge due to the released energy from the inductor. For example, while the inductor releases its stored energy, the voltage conveyed to the capacitor via the diode can transiently exceed the voltage of the voltage source connected to the inductor. The capacitor charges until the capacitor voltage approximately equals the voltage applied to the diode, at which point the diode is reverse biased. The capacitor holds a voltage due in part to the transient voltage while the voltage applied to the diode settles to the voltage of the voltage source (e.g., upon the inductor current reaching zero).

As indicated by the dashed arrow in FIG. 6C, the process 640 can be repeated to cause the firing circuit to repeatedly emit pulses of light, and be recharged immediately following each firing event. Moreover, the firing circuit may be operated such that the voltage charged on the capacitor following a given firing event is not sufficient to forward bias the diode in the charging path. In such an example, the firing circuit is not recharged and the firing circuit is re-activated by discharging the charge remaining on the capacitor to generate current through the laser diode and transistor. If the voltage on the capacitor discharges to a level sufficient to forward bias the diode in the charging current path following such a second firing (or third firing, etc.), the firing circuit can then undergo the charging mode with the capacitor recharging via the charging path.

Figure 7:
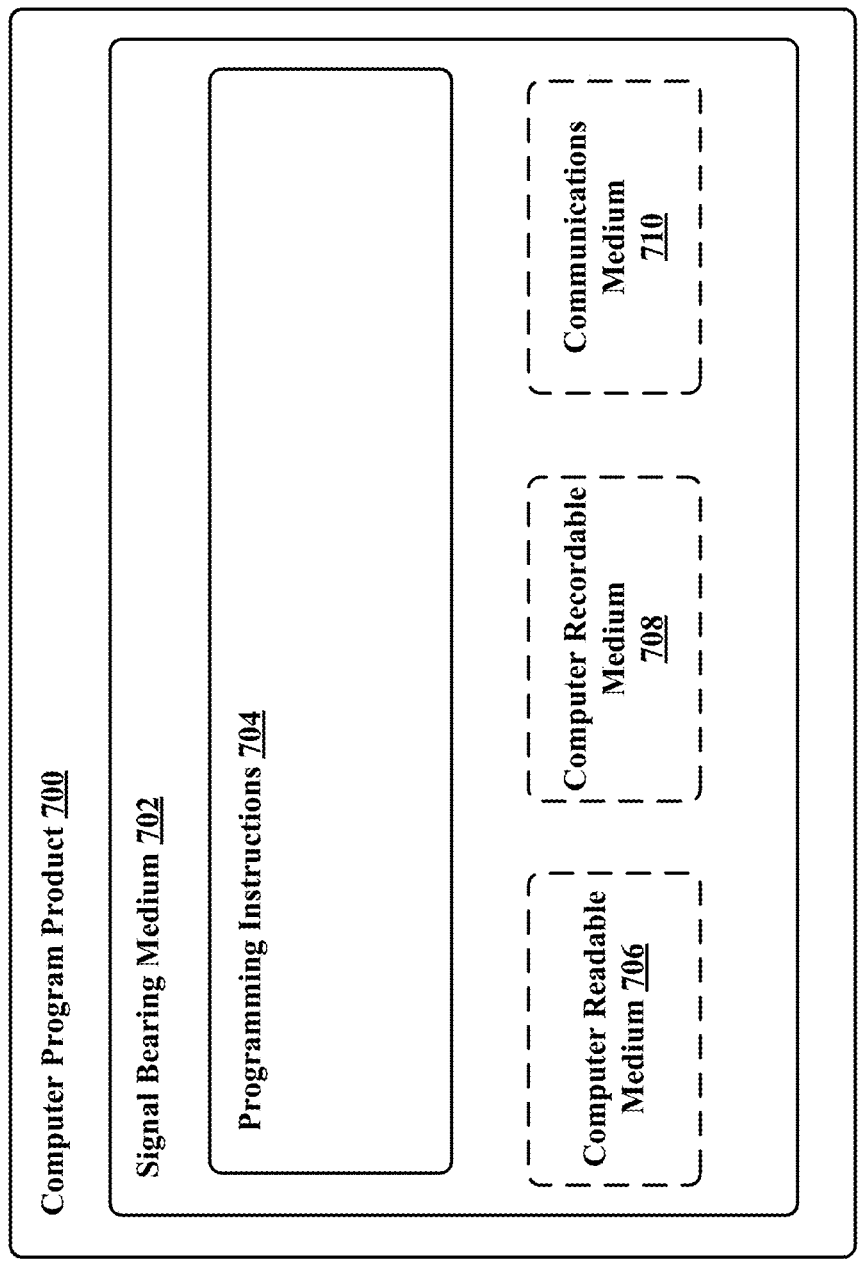
FIG. 7 depicts a non-transitory computer-readable medium configured according to an example embodiment.

FIG. 7 depicts a computer-readable medium configured according to an example embodiment. In example embodiments, the example system can include one or more processors, one or more forms of memory, one or more input devices/interfaces, one or more output devices/interfaces, and machine-readable instructions that when executed by the one or more processors cause the system to carry out the various functions, tasks, capabilities, etc., described above, such as the processes discussed in connection with FIGS. 6A through 6C above.

As noted above, in some embodiments, the disclosed techniques can be implemented by computer program instructions encoded on a non-transitory computer-readable storage media in a machine-readable format, or on other non-transitory media or articles of manufacture (e.g., the instructions 115 stored on the data storage 114 of the computer system 112 of vehicle 100). FIG. 7 is a schematic illustrating a conceptual partial view of an example computer program product 700 that includes a computer program for executing a computer process on a computing device, arranged according to at least some embodiments presented herein.

In one embodiment, the example computer program product 700 is provided using a signal bearing medium 702. The signal bearing medium 702 may include one or more programming instructions 704 that, when executed by one or more processors may provide functionality or portions of the functionality described above with respect to FIGS. 1-6. In some examples, the signal bearing medium 702 can be a non-transitory computer-readable medium 706, such as, but not limited to, a hard disk drive, a Compact Disc (CD), a Digital Video Disk (DVD), a digital tape, memory, etc. In some implementations, the signal bearing medium 702 can be a computer recordable medium 708, such as, but not limited to, memory, read/write (R/W) CDs, R/W DVDs, etc. In some implementations, the signal bearing medium 702 can be a communications medium 710, such as, but not limited to, a digital and/or an analog communication medium (e.g., a fiber optic cable, a waveguide, a wired communications link, a wireless communication link, etc.). Thus, for example, the signal bearing medium 702 can be conveyed by a wireless form of the communications medium 710.

The one or more programming instructions 704 can be, for example, computer executable and/or logic implemented instructions. In some examples, a computing device such as the computer system 112 of FIG. 1 is configured to provide various operations, functions, or actions in response to the programming instructions 704 conveyed to the computer system 112 by one or more of the computer readable medium 706, the computer recordable medium 708, and/or the communications medium 710.

The non-transitory computer readable medium could also be distributed among multiple data storage elements, which could be remotely located from each other. The computing device that executes some or all of the stored instructions could be a vehicle, such as the vehicle 200 illustrated in FIG. 2. Alternatively, the computing device that executes some or all of the stored instructions could be another computing device, such as a server.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. An apparatus, comprising:
   a voltage source;
   an inductor;
   a plurality of firing circuits connected in parallel and coupled to the voltage source via the inductor, wherein each firing circuit comprises:
   a capacitor;
   a diode coupled to the capacitor, wherein the capacitor is charged by the voltage source via the inductor when the diode is forward biased;
   a light emitting element; and
   a transistor coupled to the capacitor and the light emitting element, wherein the transistor is configured to cause the capacitor to discharge through the light emitting element thereby causing the light emitting element to emit light.

2. The apparatus of claim 1, further comprising a driver circuit configured to turn the transistors in the firing circuits on and off.

3. The apparatus of claim 2, wherein the transistors in the firing circuits are Gallium nitride field effect transistors (GaNFETs).

4. The apparatus of claim 3, wherein the driver circuit is configured to apply voltage to a gate of a GaNFET to selectively turn the GaNFET on and off.

5. The apparatus of claim 4, wherein the driver circuit is configured to discharge the firing circuits at substantially a same time by applying voltage to each of the GaNFETs in the firing circuits.

6. The apparatus of claim 1, wherein each firing circuit further comprises a discharge diode connected across the light emitting element.

7. The apparatus of claim 1, further comprising a snubber circuit connected across the inductor.

8. A method, comprising:
charging a plurality of firing circuits connected in parallel via a single inductor, wherein each firing circuit comprises a capacitor, a diode, a light emitting element, and a transistor, wherein charging each respective firing circuit comprises forward biasing the diode in the respective charging circuit and charging the capacitor in the respective firing circuit via the single inductor and the forward biased diode; and
discharging the plurality of firing circuits, wherein discharging each respective firing circuit comprises the transistor in the respective firing circuit causing the capacitor in the respective firing circuit to discharge through the light emitting element in the respective firing circuit thereby causing the light emitting element in the respective firing circuit to emit light.

9. The method of claim 8, wherein the transistor in the respective firing circuit causing the capacitor in the respective firing circuit to discharge through the light emitting element in the respective firing circuit comprises applying a first voltage to the transistor by a driver circuit.

10. The method of claim 9, wherein discharging the plurality of firing circuits comprises discharging each of the firing circuits at substantially a same time by the driver circuit applying the first voltage to each transistor in each firing circuit in the plurality of firing circuits.

11. The method of claim 10, wherein the transistors in the firing circuits are Gallium nitride field effect transistors (GaNFETs), and wherein applying the first voltage to each transistor in each firing circuit in the plurality of firing circuits comprises applying the first voltage to the gate of each GaNFET.

12. The method of claim 9, wherein charging the plurality of firing circuits occurs when the transistors in the firing circuits are off.

13. The method of claim 12, further comprising:
turning off the transistors in the firing circuits by the driver circuit applying a second voltage to the transistors in the firing circuits.

14. The method of claim 8, wherein discharging each respective firing circuit further comprises discharging an internal capacitance of the light emitting element in the respective firing circuit via a discharge diode coupled across the light emitting element in the respective firing circuit.

15. A light detection and ranging (LIDAR) device comprising:
a light source, the light source comprising:
a voltage source;
an inductor; and
a plurality of firing circuits connected in parallel and coupled to the voltage source via the inductor, wherein each firing circuit comprises:
a capacitor;
a diode coupled to the capacitor, wherein the capacitor is charged by the voltage source via the inductor when the diode is forward biased;
a light emitting element; and
a transistor coupled to the capacitor and the light emitting element, wherein the transistor is configured to cause the capacitor to discharge through the light emitting element thereby causing the light emitting element to emit light;
a light sensor configured to detect a reflected light signal comprising light from the light source reflected by a reflective object; and
a controller configured to determine a distance to the reflective object based on the reflected light signal.

16. The LIDAR device of claim 15, further comprising a driver circuit configured to turn the transistors in the firing circuits on and off.

17. The LIDAR device of claim 16, wherein the transistors in the firing circuits are Gallium nitride field effect transistors (GaNFETs), and wherein the driver circuit is configured to apply voltage to a gate of a GaNFET to selectively turn the GaNFET on and off.

18. The LIDAR device of claim 17, wherein the driver circuit is configured to discharge the firing circuits at substantially a same time by applying voltage to each of the GaNFETs in the firing circuits.

19. The LIDAR device of claim 15, wherein each firing circuit further comprises a discharge diode connected across the light emitting element.

20. The LIDAR device of claim 15, further comprising a snubber circuit connected across the inductor.

* * * * *